(12) United States Patent
Park et al.

(10) Patent No.: US 11,654,671 B2
(45) Date of Patent: May 23, 2023

(54) METHOD FOR MANUFACTURING A DISPLAY DEVICE

(71) Applicant: Samsung Display Co., Ltd., Yongin-Si (KR)

(72) Inventors: Cheolmin Park, Hwaseong-si (KR); Byunghoon Kang, Seoul (KR); Byeong-Beom Kim, Asan-si (KR); Seungho Kim, Asan-si (KR); Changmoo Lee, Suwon-si (KR); Hoikwan Lee, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/672,997

(22) Filed: Feb. 16, 2022

(65) Prior Publication Data
US 2022/0339926 A1    Oct. 27, 2022

(30) Foreign Application Priority Data
Apr. 26, 2021  (KR) .................. 10-2021-0053595

(51) Int. Cl.
*B32B 43/00*    (2006.01)
*B32B 38/10*    (2006.01)
(Continued)

(52) U.S. Cl.
CPC ............ *B32B 38/10* (2013.01); *B32B 43/006* (2013.01); *B32B 2457/20* (2013.01); *H05K 1/189* (2013.01); *H05K 3/30* (2013.01); *H05K 5/0017* (2013.01); *H05K 5/03* (2013.01); *H05K 2201/10128* (2013.01); *Y10S 156/924* (2013.01);
(Continued)

(58) Field of Classification Search
CPC ............ B32B 43/006; Y10T 156/1111; Y10T 156/1116; Y10S 156/924; Y10S 156/937
See application file for complete search history.

(56) References Cited

U.S. PATENT DOCUMENTS 9,316,850 B2   4/2016  Cho et al.
2014/0103022 A1*  4/2014  Teck .................. G02F 1/1309
                                                    83/870

FOREIGN PATENT DOCUMENTS

CN    103157646 A  *  6/2013
JP    2018-054794     4/2018
(Continued)

OTHER PUBLICATIONS

Xu, CN103157646 specification translation (Year: 2011).*

*Primary Examiner* — Philip C Tucker
*Assistant Examiner* — Nickolas R Harm
(74) *Attorney, Agent, or Firm* — F. Chau & Associates, LLC

(57) ABSTRACT

A method for manufacturing a display device includes providing a first display device assembly comprising a display module, a first window disposed on the display module, a first window adhesive layer disposed between the display module and the first window, and a first protective layer disposed on the first window. The first protective layer is removed. The first window is removed by providing an acid solution on the first display device assembly. A second window is provided that is disposed on the display module after the first window is removed. A second protective layer is provided that is disposed on the second window after the first protective layer is removed.

22 Claims, 13 Drawing Sheets

(51) Int. Cl.
    *H05K 5/00*         (2006.01)
    *H05K 1/18*         (2006.01)
    *H05K 3/30*         (2006.01)
    *H05K 5/03*         (2006.01)

(52) U.S. Cl.
    CPC ....... *Y10S 156/937* (2013.01); *Y10T 156/1111* (2015.01); *Y10T 156/1116* (2015.01)

(56) References Cited

FOREIGN PATENT DOCUMENTS

| | | |
|---|---|---|
| KR | 10-2011-0079151 | 7/2011 |
| KR | 10-2012-0136589 | 12/2012 |
| KR | 10-1536751 | 7/2015 |

\* cited by examiner

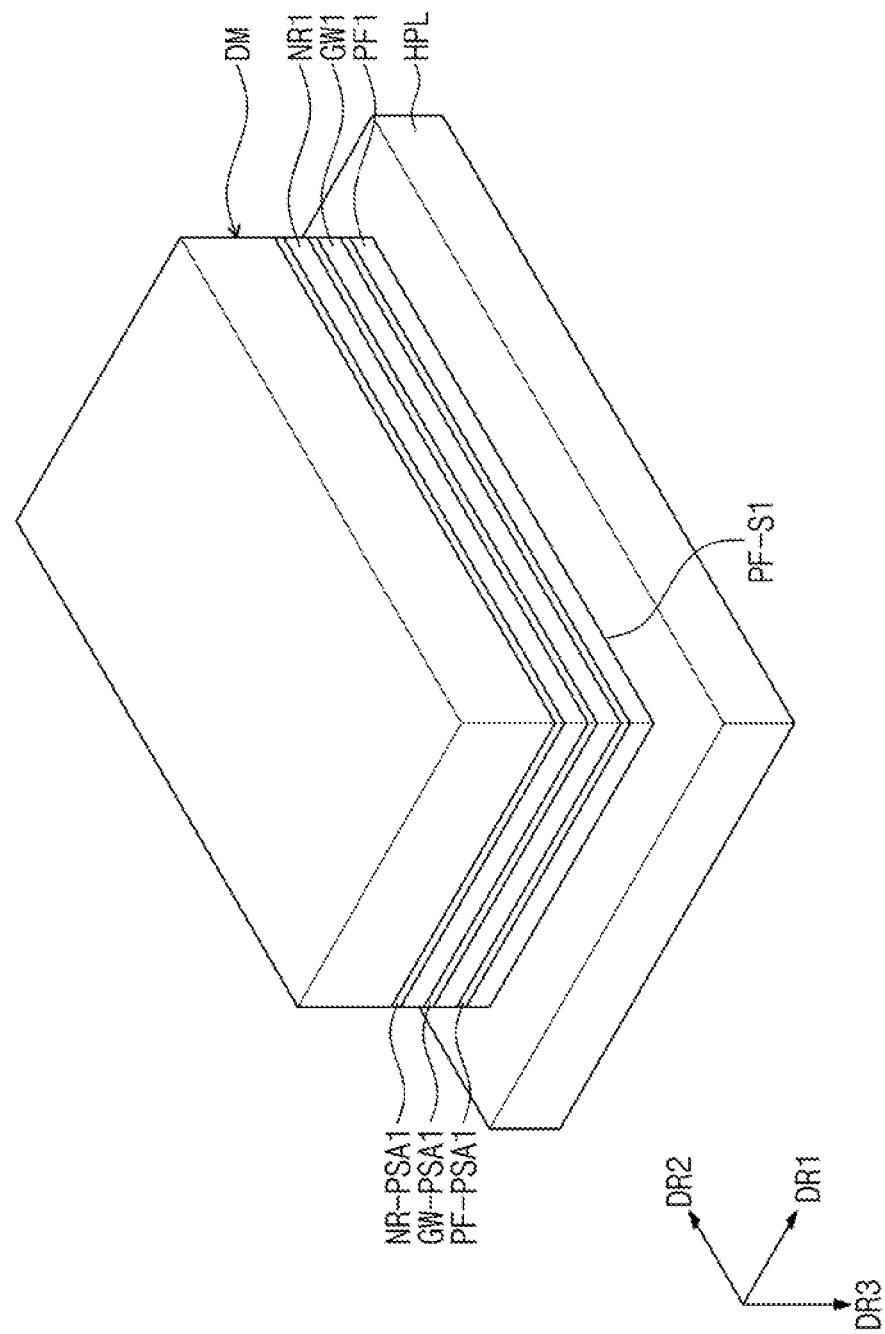

METHOD FOR MANUFACTURING A DISPLAY DEVICE

CROSS-REFERENCE TO RELATED APPLICATIONS

This application claims priority under 35 U.S.C. § 119 to Korean Patent Application No. 10-2021-0053595, filed on Apr. 26, 2021 in the Korean Intellectual Property Office, the disclosure of which is incorporated by reference in its entirety herein.

1. TECHNICAL FIELD

The present inventive concept relates to a method of manufacturing a display device, and more particularly, to a method of manufacturing a display device including a method of replacing a window.

2. DISCUSSION OF RELATED ART

Display devices are used to provide images in many different types of electronic devices, such as smart phones, tablet personal computers, notebook computers, and smart televisions. A display device may include a display module, a window disposed on the display module, and the like.

In a method of manufacturing a display device, when a defect occurs in a component, such as the window, the defective component is removed and the remaining components may be reused. When the defective components disposed in the display module are removed, components in which a defect has not occurred may be damaged which results in a decrease in the yield and cost efficiency of the manufacturing method.

SUMMARY

The present inventive concept provides a method of manufacturing a display device, the method being capable of reusing at least one component included in the display device.

According to an embodiment of the present inventive concept, a method for manufacturing a display device includes providing a first display device assembly comprising a display module, a first window disposed on the display module, a first window adhesive layer disposed between the display module and the first window, and a first protective layer disposed on the first window. The first protective layer is removed. The first window is removed by providing an acid solution on the first display device assembly. A second window is provided that is disposed on the display module after the first window is removed. A second protective layer is provided that is disposed on the second window after the first protective layer is removed.

In an embodiment, the providing of the acid solution on the first display device may include immersing the first display device assembly in the acid solution.

In an embodiment, the removing of the first window may include spraying the acid solution onto a surface of the first window.

In an embodiment, the removing of the first window may be performed by providing the acid solution at a temperature in a range of about 10° C. to about 60° C. for about 5 minutes to about 30 minutes.

In an embodiment, the acid solution may include at least one compound selected from hydrogen fluoride (HF), ammonium hydrogen fluoride ($NH_4HF_2$), and ammonium fluoride ($NH_4F$).

In an embodiment, a weight percent of hydrogen fluoride is in a range of about 0.1 wt % to about 30 wt % based on a total weight of the acid solution, and a weight percent of each of the ammonium hydrogen fluoride and the ammonium fluoride is in a range of about 0.5 wt % to about 50 wt % based on the total weight of the acid solution.

In an embodiment, the acid solution may include at least one compound selected from sulfuric acid ($H_2SO_4$), hydrochloric acid (HCl), and nitroxyl (HNO).

In an embodiment, a weight percent of each of the sulfuric acid, the hydrochloric acid, and the nitroxyl is in a range of about 0.1 wt % to about 20 wt % based on a total weight of the acid solution.

In an embodiment, the first protective layer is removed by applying heat to the first display device assembly, the applying of the heat to the first display device assembly may include: disposing the first display device assembly on a heating plate so that an upper surface of the first protective layer is adjacent to the heating plate; heating the first display device assembly at a temperature in a range of about 60° C. to about 100° C. for about 1 minute to about 5 minutes; and detaching the first protective layer from the first display device assembly.

In an embodiment, the method may further include after the removing of the first window: removing the first window adhesive layer by providing a removal solution on the first window adhesive layer, and providing a second window adhesive layer on the display module after the first window adhesive layer is removed, wherein the removal solution may include at least one compound selected from acetone ($CH_3COCH_3$), methanol ($CH_3OH$), ethanol ($C_2H_5OH$), and isopropyl alcohol ($C_3H_8O$).

In an embodiment, the first display device assembly may further include an optical film disposed between the display module and the first window, and after the removing of the first window, the method may further include removing the optical film by applying heat to the optical film.

In an embodiment, the method may further include cleaning the first window adhesive layer and the display module after the removing of the first window.

In an embodiment, the method may further include attaching a carrier film to a lower surface of the display module before the providing of the acid solution.

In an embodiment, the display module may include a display panel and a flexible circuit board disposed on a first side of the display panel, and the method may further include separating the flexible circuit board from the first side of the display panel before the removing of the first window.

In an embodiment, the method may further include providing the separated flexible circuit board to the first side of the display panel after the providing of the second protective layer.

In an embodiment, a thickness of the first window may be in a range of about 20 μm to about 100 μm.

In an embodiment, a thickness of the first window adhesive layer may be in a range of about 5 μm to about 30 μm.

According to an embodiment of the present inventive concept, a method for manufacturing a display device includes providing a first display device assembly including a display module, a first window adhesive layer disposed on the display module, a first window disposed on the first window adhesive layer, and a first protective layer disposed on the first window. The first protective layer is removed. The first window is removed by providing an acid solution on the first display device assembly. A second window is provided that is disposed on the display module after the first window has been removed. A second display device assembly is formed by providing a second protective layer on the second window. A ratio of a first adhesive strength of the first window adhesive layer to the first window to a second adhesive strength of the first window adhesive layer to the second window is in a range of about 1:1 to about 1:0.9.

In an embodiment, the acid solution may include at least one compound selected from hydrogen fluoride (HF) having a weight percent in a range of about 0.1 wt % to about 30 wt % based on a total weight of the acid solution, ammonium hydrogen fluoride ($NH_4HF_2$) having a weight percent in a range of about 0.5 wt % to about 50 wt % based on the total weight of the acid solution, and ammonium fluoride ($NH_4F$) having a weight percent in a range of about 0.5 wt % to about 50 wt % based on the total weight of the acid solution.

In an embodiment, the acid solution may further include at least one compound selected from sulfuric acid ($H_2SO_4$), hydrochloric acid (HCl), and nitroxyl (HNO), and a weight percent of each of the sulfuric acid, the hydrochloric acid, and the nitroxyl may be in a range of about 0.1 wt % to about 20 wt % based on the total weight of the acid solution.

In an embodiment, a method for manufacturing a display device includes providing a first display device assembly comprising a display module, a first window disposed on the display module, and a plurality of first layers disposed between the first window and the display module, the plurality of first layers including at least one of a first optical adhesive layer, a first optical layer, and a first window adhesive layer. The first window is removed by providing an acid solution on the first display device assembly. A second window is provided that is disposed on the display module after the first window is removed to provide a second display device assembly. The second display device assembly includes at least one of the plurality of first layers included in the first display device assembly.

In an embodiment, at least one of the plurality of first layers is removed and each of the at least one of the plurality of first layers that was removed is replaced with a second layer to form the second display device assembly.

BRIEF DESCRIPTION OF THE DRAWINGS

The accompanying drawings are included to provide a further understanding of the present inventive concept, and are incorporated in and constitute a part of this specification. The drawings illustrate embodiments of the present inventive concept and, together with the description, serve to explain principles of the present inventive concept. In the drawings:

FIG. 6 is a perspective view schematically illustrating steps in the method of manufacturing the display device according to an embodiment of the present inventive concept;

DETAILED DESCRIPTION OF EMBODIMENTS

Figure 1A:
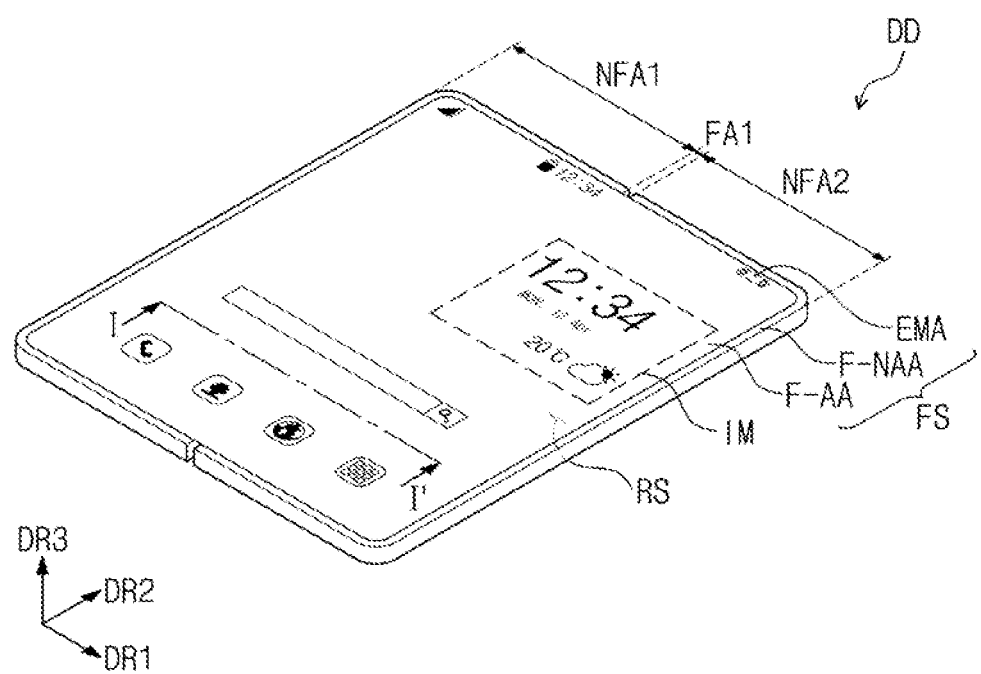
FIG. 1A is a perspective view of a display device according to an embodiment of the present inventive concept.

In this specification, it will be understood that when an element (or region, layer, portion, etc.) is referred to as being "on", "connected to" or "coupled to" another element, it can be directly on, connected or coupled to the other element, or intervening elements may be present. When an element, region, layer, portion, etc. is referred to as being "directly on", "directly connected to" or "directly coupled to" another element, no intervening elements may be present.

Like reference numerals refer to like elements throughout. In addition, in the drawings, the thicknesses, ratios, and dimensions of elements may be exaggerated for effective description of the technical contents.

As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present inventive concept. Similarly, the second element may also be referred to as the first element. The terms of a singular form include plural forms unless otherwise specified.

Terms, such as "below", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present inventive concept will be described with reference to the accompanying drawings.

Figure 1B:
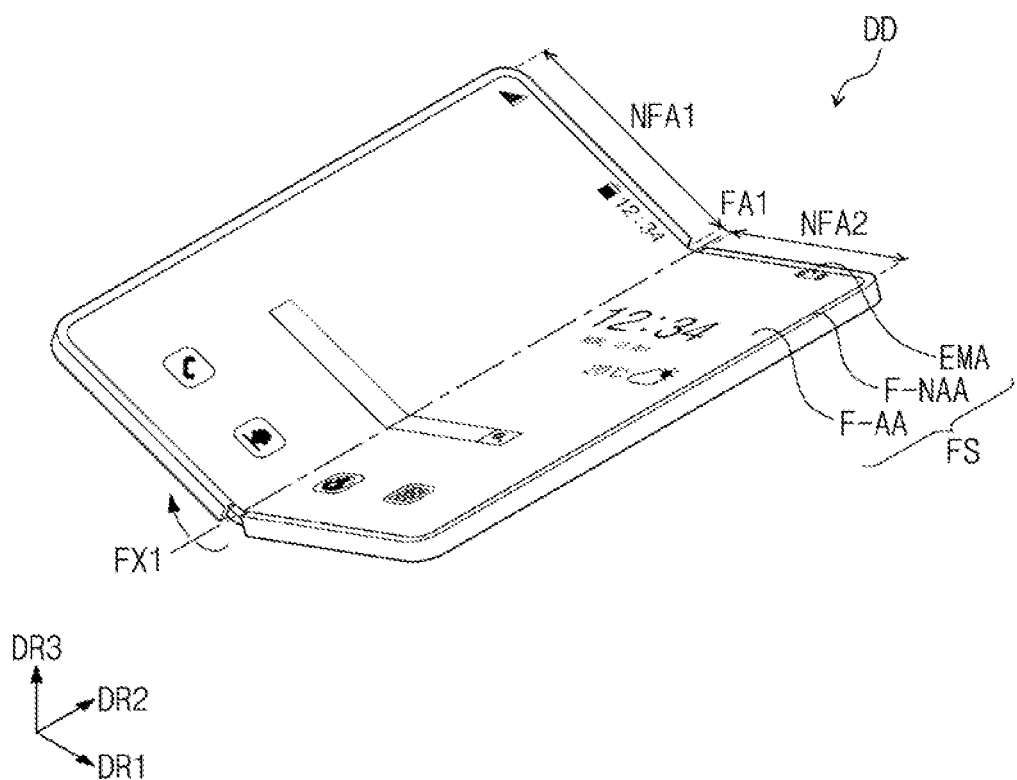
FIG. 1B is a perspective view illustrating an in-folding process of the display device illustrated in FIG. 1A according to an embodiment of the present inventive concept.

FIGS. 1A and 1B are perspective views illustrating a display device DD according to an embodiment of the present inventive concept. The display device DD may be manufactured by a method of manufacturing a display device according to an embodiment of the present inventive concept. Hereinafter, the method of manufacturing the display device according to an embodiment of the present inventive concept will be described in more detail.

The display device DD may be a device that is activated according to an electrical signal. For example, in an embodiment, the display device DD may be a personal digital terminal, a tablet, a car navigation unit, a game machine, or a wearable device. However, embodiments of the present inventive concept are not limited thereto and the display device may be various other types of small, medium or large-sized electronic devices. FIG. 1A illustrates, as an example, that the display device DD is a portable electronic device.

The display device DD according to an embodiment of the present inventive concept may be flexible. The expression "flexible" refers to a property, which can be bent, and may range from a structure that can be completely folded to a structure that can be bent at a level of several nanometers. For example, the display device DD may be a foldable display device. However, embodiments of the present inventive concept are not limited thereto. For example, the display device DD may be a rigid display device.

The thickness direction of the display device DD may be a direction parallel to a third direction axis DR3, which is a normal direction with respect to a plane defined by a first direction axis DR1 and a second direction axis DR2. Directions indicated by the first to third direction axes DR1, DR2, and DR3 described herein are relative concepts and may be converted to other directions. In addition, the directions indicated by the first to third direction axes DR1, DR2, and DR3 may be described as first to third directions, and the same reference numerals may be used therefor. In an embodiment, the first direction axis DR1 and the second direction axis DR2 may be orthogonal to each other, and the third direction axis DR3 may be a normal direction with respect to a plane defined by the first direction axis DR1 and the second direction axis DR2. However, embodiments of the present inventive concept are not limited thereto and the first, second and third directions DR1 to DR3 may cross each other at various different angles.

The display device DD may include a first display surface FS extending in a plane defined by the first direction axis DR1 and the second direction axis DR2. The display device DD may display an image IM through the first display surface FS. The display device DD may display an image IM in the direction of the third direction axis DR3 on the first display surface FS extending in the plane defined in the first direction axis DR1 and the second direction axis DR2.

The display device DD may include a first display surface FS and a second display surface RS. The first display surface FS may include a first active region F-AA and a first non-active region F-NAA. A module region EMA may be included in the first active region F-AA. The display device DD may include an electronic module disposed to correspond to (e.g., be disposed in) the module region EMA. For example, in an embodiment, the electronic module may include one or more modules selected from a camera, a light detection sensor, and a heat detection sensor. However, embodiments of the present inventive concept are not limited thereto and the electronic module may include various other electronic modules.

The display device DD may display an image IM through the first active region F-AA. For example, as shown in the embodiment of FIG. 1A, the image IM may be software application icons and a clock, temperature and calendar window. However embodiments of the present inventive concept are not limited thereto and the image IM may be various different subject matter. In addition, various types of external inputs may be detected in the first active region F-AA. The first non-active region F-NAA may be adjacent to the first active region F-AA. The first non-active region F-NAA may surround the first active region F-AA (e.g., in the first and/or second directions DR1, DR2). The shape of the first active region F-AA may be substantially defined by the first non-active region F-NAA. While the embodiment of FIG. 1A shows the first non-active region F-NAA completely surrounding the first active region F-AA (e.g., in the first and second directions DR1, DR2), embodiments of the present inventive concept are not limited thereto. For example, in an embodiment, the first non-active region F-NAA may not be disposed adjacent to at least one side of the first active region F-AA, or the first non-active region F-NAA may be omitted. While the shape of the first active region F-AA in the embodiment of FIG. 1A is a rectangle with rounded corners, embodiments of the present inventive concept are not limited thereto and the display device DD may include various shapes of active regions.

The second display surface RS may be defined as a surface facing at least a portion of the first display surface FS and may be spaced apart from the first display surface FS in the third direction DR3. For example, the second display surface RS may be defined as a portion of the rear surface of the display device DD.

The display device DD may include a folding region FA1 and non-folding regions, such as first and second non-folding regions NFA1 and NFA2. In an embodiment, the display device DD may include the first non-folding region NFA1 and the second non-folding region NFA2 with one folding region FA1 interposed therebetween (e.g., in the first direction DR1). However, this is just an example, and the number of folding regions, the number of non-folding regions and the arrangement thereof may vary in embodiments of the present inventive concept.

FIG. 1B is a perspective view illustrating an in-folding process of the display device DD of FIG. 1A. The display device DD may be folded along the folding axis FX1 extending in the second direction axis DR2. FIG. 1B illustrates one folding axis FX1. However, embodiments of the present inventive concept are not limited thereto and the number of folding axes FX1 may vary.

When the display device DD is in-folded, the first non-folding region NFA1 and the second non-folding region NFA2 may face each other. When the display device DD is in-folded, the first display surface FS may not be exposed to a user, but the second display surface RS may be exposed to the user. However, embodiments of the present inventive concept are not limited thereto. For example, in an embodiment, the display device DD may be out-folded so that the first display surface FS is exposed and the second display surface RS is not exposed.

Figure 2:
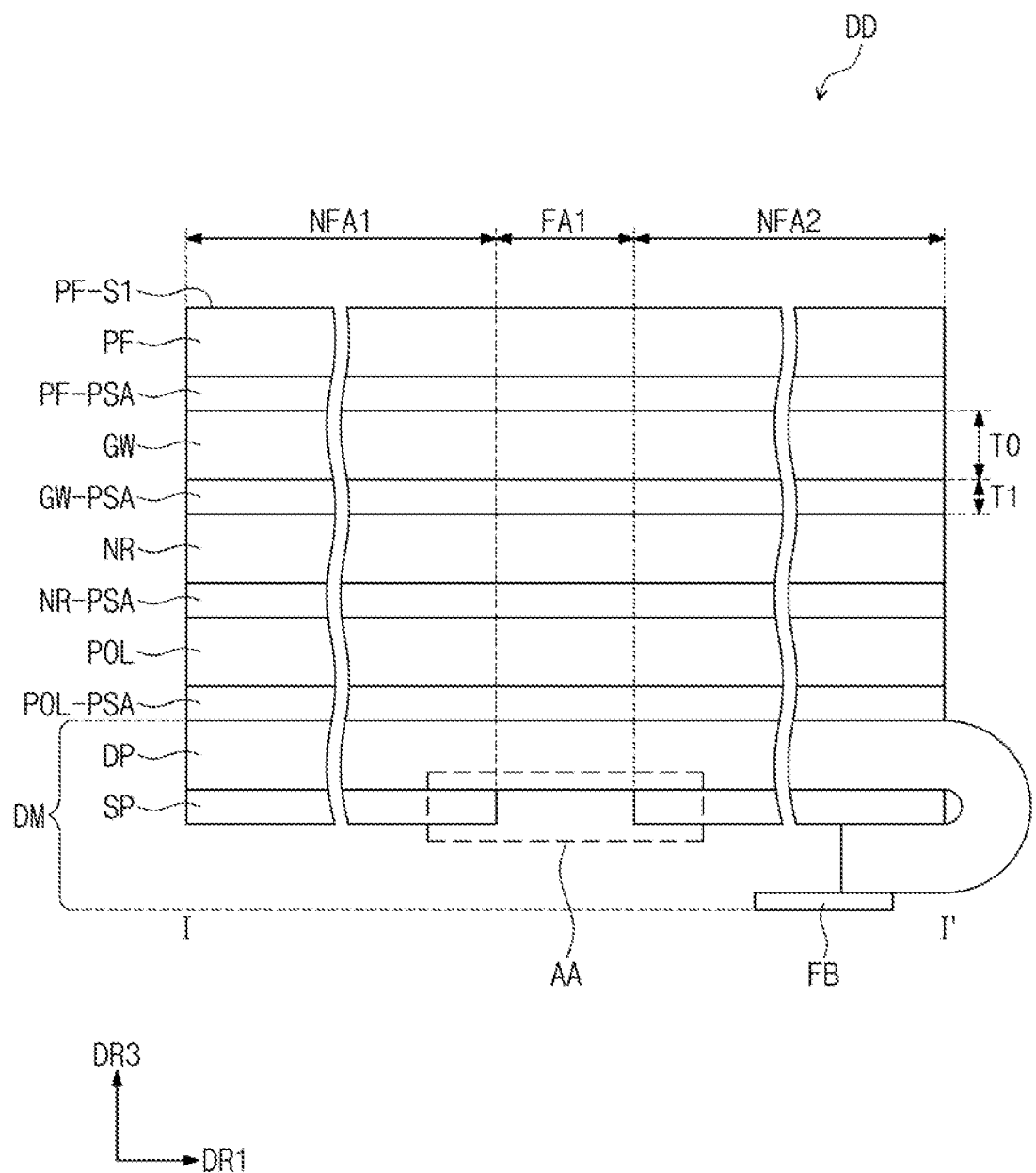
FIG. 2 is a cross-sectional view of a display device taken along line I-I' of FIG. 1A according to an embodiment of the present inventive concept.

FIG. 2 is a cross-sectional view illustrating a portion taken along line I-I' of FIG. 1A. The display device DD may include a display module DM, a window GW disposed on the display module DM, a window adhesive layer GW-PSA disposed between the display module DM and the window GW (e.g., in the third direction DR3), and a protective layer PF disposed on the window GW. In addition, the display device DD may include a polarizing layer POL, and an optical film NR disposed between the display module DM and the window adhesive layer GW-PSA (e.g., in the third direction DR3). The polarizing layer POL may be adjacent to the display module DM (e.g., in the third direction DR3), and the optical film NR may be adjacent to the window adhesive layer GW-PSA (e.g., in the third direction DR3). For example, the polarizing layer POL and the optical film NR may be sequentially stacked on the display module DM.

The protective layer PF may be disposed on the front surface of the display device DD. In an embodiment, the protective layer PF may protect components disposed thereunder. For example, the protective layer PF may protect the window GW. In an embodiment, the protective layer PF may include a hard coating layer, an anti-fingerprint layer, and the like to increase protective properties, such as chemical resistance and abrasion resistance. For example, in an embodiment, the protective layer PF may include at least one compound selected from polyimide, polyethylene terephthalate, polyurethane, and poly methyl methacrylate. However, embodiments of the present inventive concept are not limited thereto, and the material of the protective layer PF may vary. The protective layer PF may contain a material exhibiting optically transparent properties.

A protective adhesive layer PF-PSA may be disposed between the protective layer PF and the window GW (e.g., in the third direction DR3). The protective layer PF and the window GW may be coupled to each other by the protective adhesive layer PF-PSA. The protective adhesive layer PF-PSA may be optically transparent. In an embodiment, the protective adhesive layer PF-PSA may include a pressure sensitive adhesive film PSA, an optically clear adhesive film OCA, or an optically clear adhesive resin OCR. However, embodiments of the present inventive concept are not limited thereto. For example, in some embodiments, the protective adhesive layer PF-PSA may be omitted.

The window GW may be optically transparent. For example, the window GW may contain glass. In an embodiment, the window GW may contain silicon dioxide. In a cross-section, a thickness T0 (e.g., length in the third direction DR3) of the window GW may be in a range of about 20 μm to about 100 μm. In an embodiment of the display device DD including the folding region FA1, the window GW may be a foldable flexible window.

The window adhesive layer GW-PSA may be disposed between the window GW and the optical film NR (e.g., in the third direction DR3). The window GW and the optical film NR may be coupled to each other by the window adhesive layer GW-PSA. The window adhesive layer GW-PSA may be optically transparent. In an embodiment, the window adhesive layer GW-PSA may include a pressure sensitive adhesive film PSA, an optically clear adhesive film OCA, or an optically clear adhesive resin OCR. In a cross-section, the window adhesive layer GW-PSA may have a thickness T1 (e.g., length in the third direction DR3) in a range of about 5 μm to about 30 μm.

The optical film NR and the polarizing layer POL may be members for increasing the display quality of the display device DD. In an embodiment, the polarizing layer POL may reduce the reflectance of external light incident from the outside. In an embodiment, the optical film NR may be an optical functional layer compensating for a phase of light passing through the optical film NR. For example, the optical film NR may be a phase retardation layer, a light compensation layer, or the like. In an embodiment, the optical film NR may be formed of polyimide. However, embodiments of the present inventive concept are not limited thereto, and the forming material and role of the optical film NR may vary.

In an embodiment, the display device DD may further include a shock-absorbing layer disposed adjacent to the window GW. In an embodiment, at least one of the polarizing layer POL or the optical film NR may be omitted from the display device DD. For example, the polarizing layer POL may be omitted, and the display device DD may include a color filter layer.

An optical adhesive layer NR-PSA may be disposed between the optical film NR and the polarizing layer POL (e.g., in the third direction DR3). A polarizing adhesive layer POL-PSA may be disposed between the polarizing layer POL and the display module DM (e.g., in the third direction DR3). The optical film NR and the polarizing layer POL may be coupled to each other by the optical adhesive layer NR-PSA. The polarizing layer POL and the display module DM may be coupled to each other by the polarizing adhesive layer POL-PSA.

In an embodiment, each of the optical adhesive layer NR-PSA, and the polarizing adhesive layer POL-PSA may include a pressure sensitive adhesive film PSA, an optically clear adhesive film OCA, or an optically clear adhesive resin OCR. The optical adhesive layer NR-PSA and the polarizing adhesive layer POL-PSA may be optically transparent adhesive layers. However, embodiments of the present inventive concept are not limited thereto. For example, at least one of the optical adhesive layer NR-PSA or the polarizing adhesive layer POL-PSA may be omitted in some embodiments.

According to an embodiment of the present inventive concept, the display module DM may include a display panel DP and a flexible circuit board FB disposed on one side (e.g., a first side) of the display panel DP. A portion of the display panel DP may be bent. When the display panel DP is bent, one side of the display panel DP may be adjacent to the rear surface of the display panel DP. The flexible circuit board FB disposed on one side (e.g., a first side) of the display panel DP may be adjacent to the rear surface of the display panel DP. The flexible circuit board FB may be electrically connected to the display panel DP. In addition, the display panel DP and a driving circuit board may be electrically connected to each other by the flexible circuit board FB.

The display panel DP may include a display element layer. For example, in an embodiment, the display element layer may include an organic light-emitting element, a quantum dot light-emitting element, a liquid crystal element layer, or the like. However, embodiments of the present inventive concept are not limited thereto and the display element layer may vary.

In addition, the display module DM may further include a support member SP disposed under the display panel DP (e.g., in a direction opposite to the third direction DR3). In an embodiment, the support member SP may not overlap the folding region FA1 (e.g., in the third direction DR3) and may overlap the first and second non-folding regions NFA1 and NFA2 (e.g., in the third direction DR3). However, embodiments of the present inventive concept are not limited thereto, and the support member SP may overlap a portion of the first folding region FA1 in some embodiments.

Figure 3:
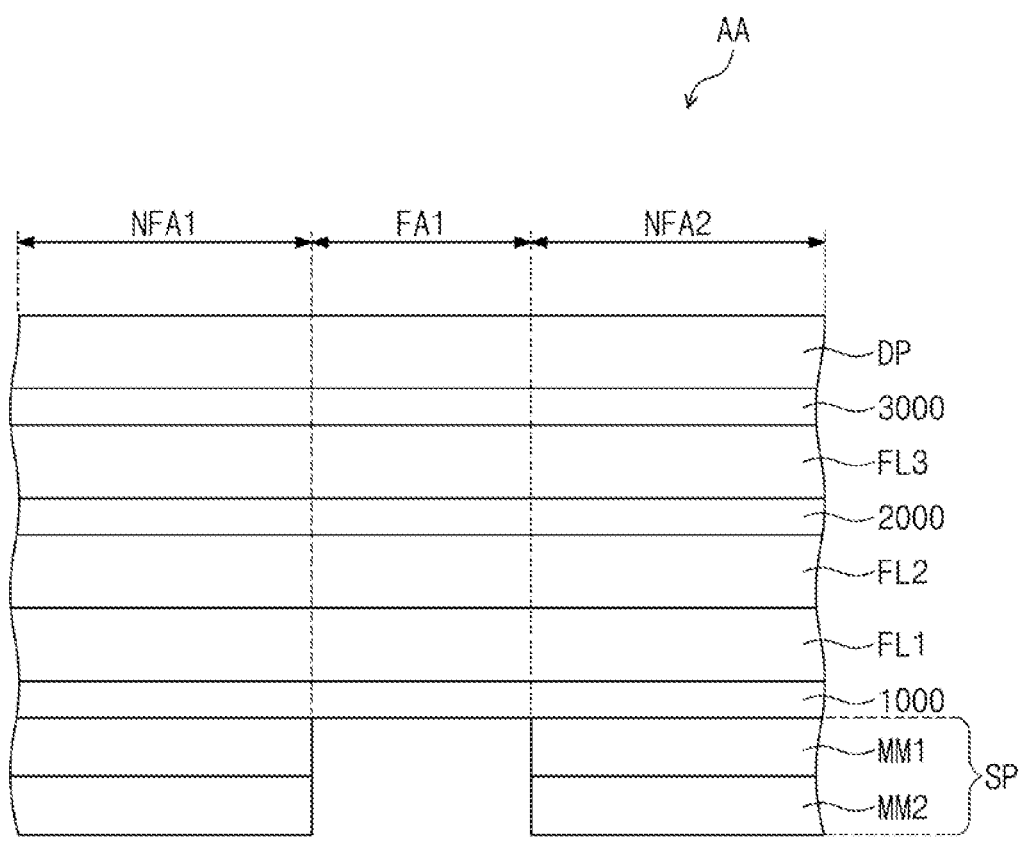
FIG. 3 is a cross-sectional view of region AA of FIG. 2 according to an embodiment of the present inventive concept.

FIG. 3 is an enlarged view of a portion corresponding to region AA of FIG. 2. Referring to FIG. 3, the support member SP may include a first support member MM1 and a second support member MM2. The first support member MM1 may be disposed on the second support member MM2 (e.g., disposed directly thereon in the third direction DR3). The first support member MM1 may support components disposed above the first support member MM1. In an embodiment, the second support member MM2 may include a heat dissipation member, a shield member, or an insulating member. Each of the first support member MM1 and the second support member MM2 may be formed of a metal alloy. For example, each of the first support member MM1 and the second support member MM2 may be formed of stainless steel, aluminum, copper, or an alloy thereof. However, embodiments of the present inventive concept are not limited thereto, and materials included in the first and second support members MM1 and MM2 may vary.

In an embodiment of the present inventive concept, at least one functional layer may be disposed between the display panel DP and the support member SP. For example, a first functional layer FL1, a second functional layer FL2, and a third functional layer FL3 may be sequentially stacked on the support member SP (e.g., in the third direction DR3). The display panel DP may be disposed on the third functional layer FL3. In an embodiment, the third functional layer FL3 may be a protective film of the display panel DP. For example, the third functional layer FL3 may be a colored polyimide film. The second functional layer FL2 may be a barrier film. The second functional layer FL2 may prevent deformation of the display panel DP. The first functional layer FL1 may be a cushion layer. For example, the first functional layer FL1 may contain foam or sponge. However, embodiments of the present inventive concept are not limited thereto.

First to third sub-adhesive layers 1000, 2000, and 3000 may be disposed between the display panel DP and the third functional layer FL3, between the third functional layer FL3 and the second functional layer FL2, and between the first functional layer FL1 and the support member SP. For example, a third sub-adhesive layer 3000 may be disposed between the display panel DP and the third functional layer FL3 (e.g., in the third direction DR3). A second sub-adhesive layer 2000 may be disposed between the third functional layer FL3 and the second functional layer FL2 (e.g., in the third direction DR3). A first sub-adhesive layer 1000 may be disposed between the first functional layer FL1 and the support member SP (e.g., in the third direction DR3). In an embodiment, each of the first sub-adhesive layer 1000, the second sub-adhesive layer 2000, and the third sub-adhesive layer 3000 may include a pressure sensitive adhesive film PSA, an optically clear adhesive film OCA, or an optically clear adhesive resin OCR. However, embodiments of the present inventive concept are not limited thereto. For example, at least one of the first to third sub-adhesive layers 1000, 2000, and 3000 may be omitted in some embodiments.

Figure 4:
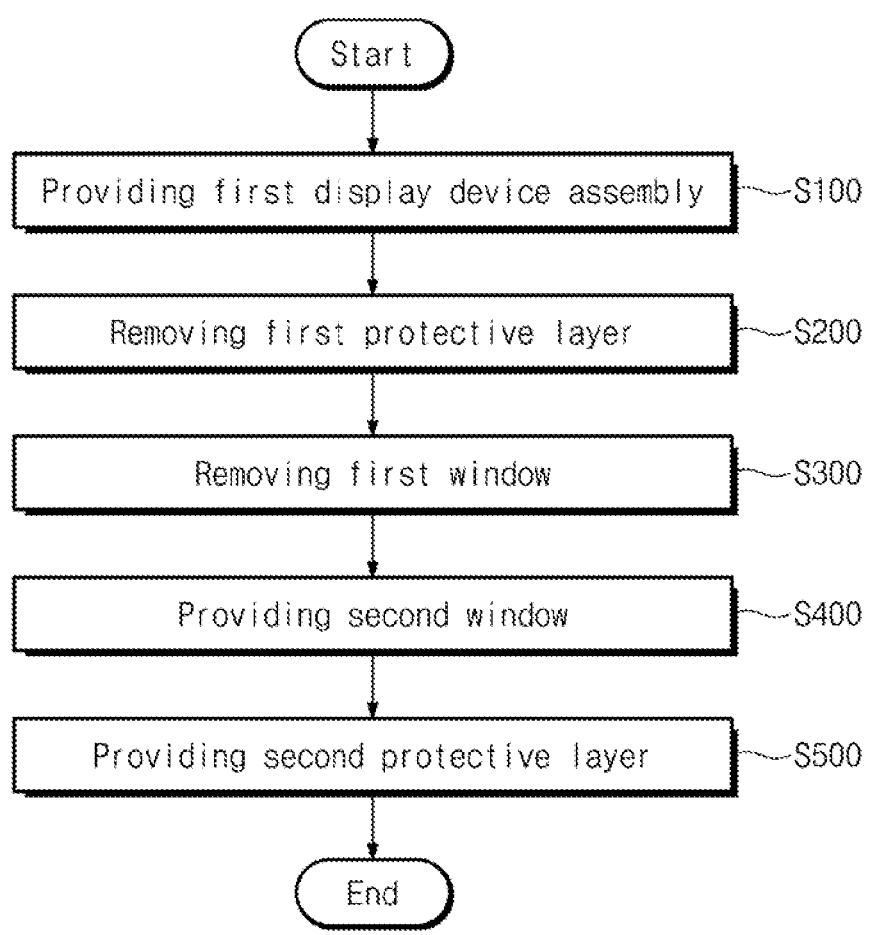
FIG. 4 is a flowchart illustrating a method of manufacturing a display device according to an embodiment of the present inventive concept.
Figure 5:
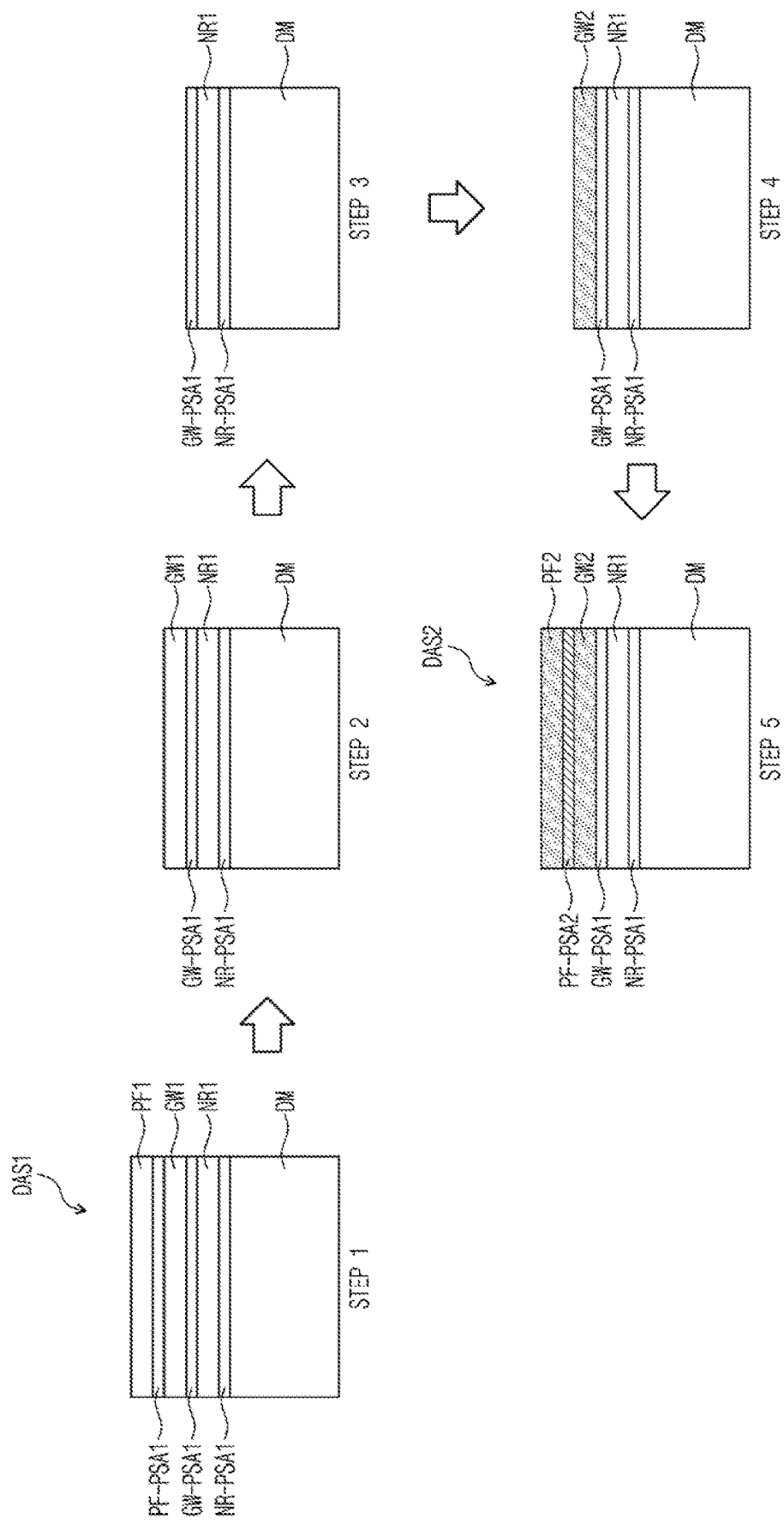
FIG. 5 is a diagram illustrating steps in the method of manufacturing the display device according to an embodiment of the present inventive concept.
Figure 7A:
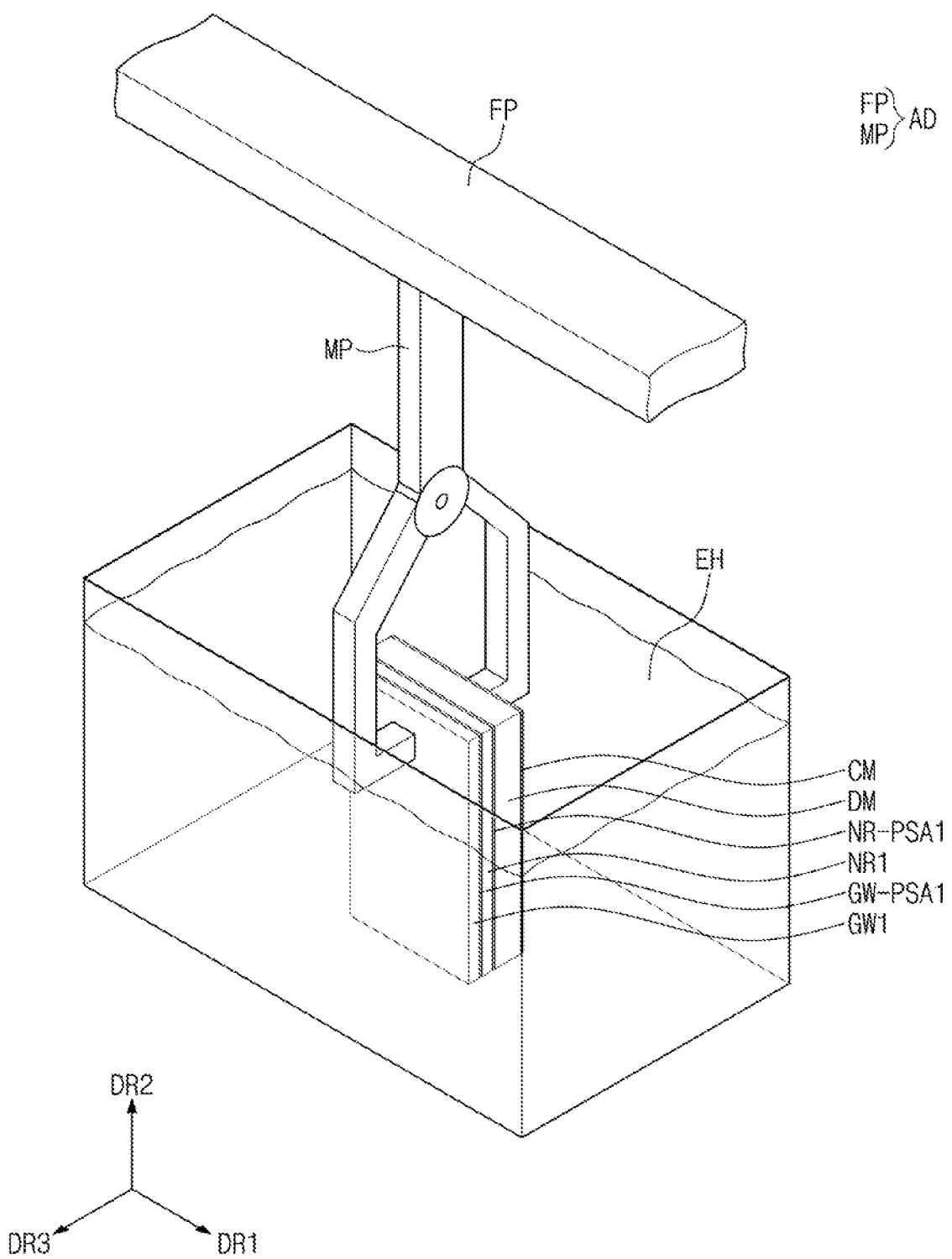
FIG. 7A is a perspective view schematically illustrating steps in the method of manufacturing the display device according to an embodiment of the present inventive concept.
Figure 7B:
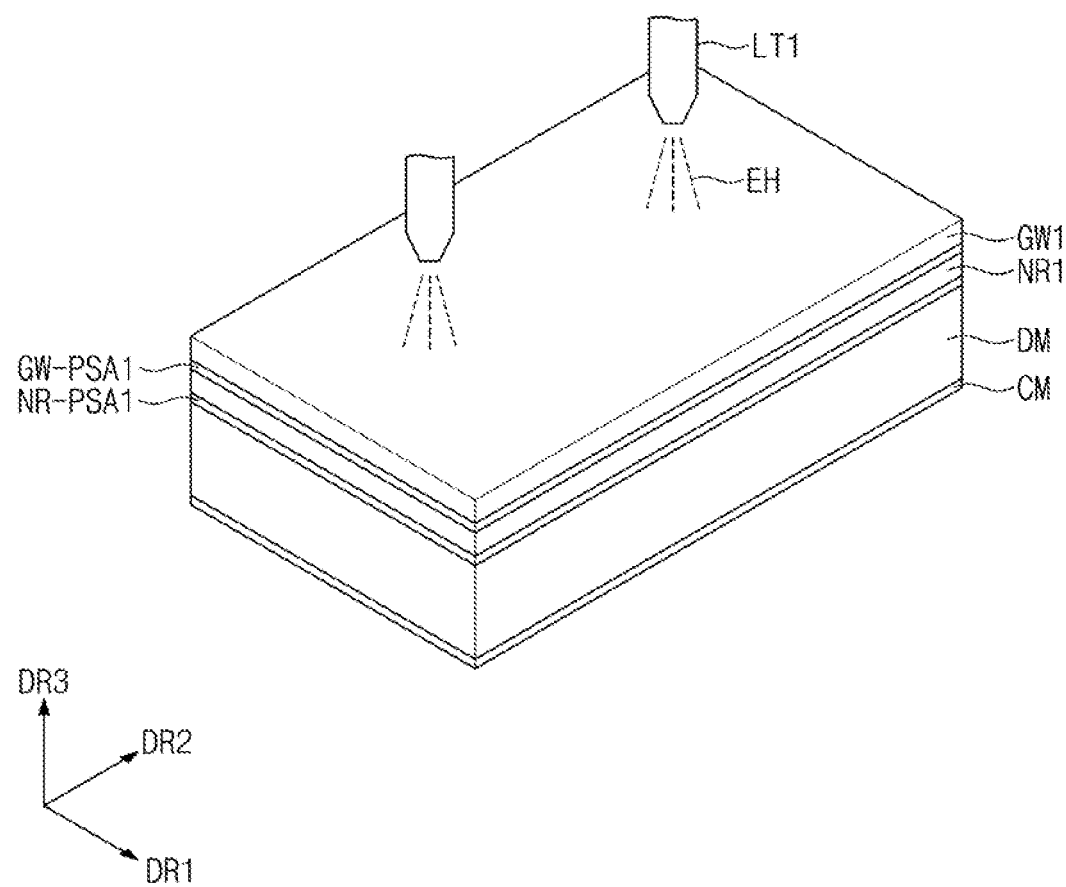
FIG. 7B is a perspective view schematically illustrating steps in the method of manufacturing the display device according to an embodiment of the present inventive concept.

FIG. 4 is a flowchart illustrating a method of manufacturing a display device according to an embodiment of the present inventive concept. FIG. 5 is a diagram illustrating steps in the method of manufacturing the display device. FIGS. 6 to 7B are perspective views schematically illustrating steps in the method of manufacturing the display device.

The above-described display device DD may be fabricated by a method for manufacturing a display device according to an embodiment of the present inventive concept. The method for manufacturing a display device according to an embodiment of the present inventive concept may include providing a first display device assembly in block S100, removing a first protective layer in block S200, removing a first window in block S300, providing a second window in block S400, and providing a second protective layer in block S500.

A first manufacturing step STEP 1 in FIG. 5 comprises the manufacture of a first display device assembly DAS1. In an embodiment of the present inventive concept, the first display device assembly DAS1 may include a display module DM, a first window GW) disposed on the display module DM, a first window adhesive layer GW-PSA1 disposed between the display module DM and the first window GW1, and a first protective layer PF1 disposed on the first window GW1. In an embodiment, the first protective layer PF1 and the first window GW1 may correspond to the protective layer PF and the window GW in FIG. 2, respectively. For example, the first window adhesive layer GW-PSA1 may be disposed on the display module DM, and the first window GW1 may be disposed on the first window adhesive layer GW-PSA1. In an embodiment, a first protective adhesive layer PF-PSA1 may be disposed between the first window GW1 and the first protective layer PF1. In addition, the first display device assembly DAS1 may further include a first optical film NR1 disposed between the display module DM and the first window GW1. A first optical adhesive layer NR-PSA1 may be disposed between the display module DM and the first optical film NR1. In an embodiment, the first display device assembly DAS1 may include various additional layers. In an embodiment, a defect may occur in at least one of the components included in the first display device assembly DAS1, and a defective component may be removed. A new component may then be provided to replace a removed component. After a new component is provided, a second display device assembly DAS2 may be formed. The second display device assembly DAS2 may include a new component and may be formed by reusing one or more components of the first display device assembly DAS1 which do not have defects.

Each of a second manufacturing step STEP 2 and a third manufacturing step STEP 3 in FIG. 5 illustrates a state in which components, such as defective components, disposed above the display module DM are removed from the first display device assembly DAS1. A fourth manufacturing step STEP 4 and a fifth manufacturing step STEP 5 in FIG. 5 illustrate states in which new components are provided under the display module DM.

For example, the second manufacturing step STEP 2 in FIG. 5 illustrates a state in which the first protective layer PF1 and the first protective adhesive layer PF-PSA1 are removed from the first display device assembly DAS1. The second manufacturing step STEP 2 illustrates a state in which the first optical adhesive layer NR-PSA1, the first optical film NR1, the first window adhesive layer GW-PSA1, and the first window GW1 are sequentially stacked above the display module DM and the upper surface of the first window GW1 is exposed.

The third manufacturing step STEP 3 illustrates a state in which the first window GW1 disposed on the first window adhesive layer GW-PSA1 in the second manufacturing step STEP 2 is removed and the upper surface of the first window adhesive layer GW-PSA1 is exposed. The third manufacturing step STEP 3 illustrates a state in which the first optical adhesive layer NR-PSA1, the first optical film NR1, and the first window adhesive layer GW-PSA1 are sequentially stacked above the display module DM.

The fourth manufacturing step STEP 4 illustrates a state in which a second window GW2 is provided on (e.g., disposed directly on) the exposed first window adhesive layer GW-PSA1 illustrated in the third manufacturing step STEP 3. The fourth manufacturing step STEP 4 illustrates a state in which the first optical adhesive layer NR-PSA1, the first optical film NR1, the first window adhesive layer GW-PSA1, and the second window GW2 are stacked above the display module DM and the second window GW2 forms an upper surface of the assembly.

The fifth manufacturing step STEP 5 illustrates a state in which a second protective adhesive layer PF-PSA2 and a second protective layer PF2 are provided above the second window GW2 illustrated in the fourth manufacturing step STEP 4 and the second protective layer PF2 forms an upper surface of the assembly. The fifth manufacturing step STEP 5 illustrates a state in which the first optical adhesive layer NR-PSA1, the first optical film NR1, the first window adhesive layer GW-PSA1, the second window GW2, the second protective adhesive layer PF-PSA2, and the second protective layer PF2 are consecutively stacked above the display module DM. However, embodiments of the present inventive concept are not limited thereto. For example, in some embodiments, the second protective adhesive layer PF-PSA2 may be omitted.

In an embodiment, the first display device assembly DAS1 may further include a polarizing layer POL (see FIG. 2) and a polarizing adhesive layer POL-PSA (see FIG. 2) disposed between the display module DM and the first optical film NR1. Components such as the second window GW2 and the second protective layer PF2 may be disposed above the polarizing layer POL (see FIG. 2).

The first protective layer PF1 may be removed when proceeding from the first manufacturing step STEP 1 to the second manufacturing step STEP 2. A method of manufacturing a display device according to an embodiment of the present inventive concept may include removing the first protective layer by applying heat to the first display device assembly in block S200 of FIG. 4. The removing of the first protective layer in block S200 may include disposing the first display device assembly DAS1 on the heating plate HPL, heating the first display device assembly DAS1, and detaching the first protective layer PF1 from the first display device assembly DAS1.

Referring to FIG. 6, in an embodiment, when the first display device assembly DAS1 is mounted on (e.g., disposed on) the heating plate HPL, the upper surface PF-S1 of the first protective layer PF1 may be disposed on the heating plate HPL to directly contact the heating plate HPL. However, embodiments of the present inventive concept are not limited thereto. The upper surface PF-S1 of the first protective layer PF1 may be a surface exposed to the outside. The upper surface PF-S1 of the first protective layer PF1 and the lower surface of the first protective layer PF1 may face each other in the third direction DR3. The lower surface of the first protective layer PF1 may be a surface adjacent to the first window GW1. In an embodiment, the upper surface PF-S1 of the first protective layer PF1 may be placed in direct contact with the heating plate HPL to apply heat to the first protective layer PF1 and the first protective adhesive layer PF-PSA1. As heat is applied, the first protective adhesive layer PF-PSA1 may be softened, and the first protective layer PF1 and the first protective adhesive layer PF-PSA1 may be removed from the first display device assembly DAS1.

In an embodiment, the heating of the first display device assembly DAS1 may be performed at a temperature in a range of about 60° C. to about 100° C. for about 1 minute to about 5 minutes. In embodiments in which the first display device assembly DAS) is heated at a temperature of less than about 60'C or for less than about 1 minute, it may be difficult to remove the first protective layer PF1. For example, in embodiments in which heat is applied at a temperature of less than about 60° C. or for less than about 1 minute, the first protective adhesive layer may be insufficiently softened so that the first protective layer may not be detachable from the first display device assembly.

On the other hand, in embodiments in which the first display device assembly DAS1 is heated at a temperature of greater than about 100° C. or for more than about 5 minutes, a component disposed under the first protective layer PF1 may be damaged. For example, the display module DM or the like disposed under the first protective layer PF1 may be damaged by heat applied by the heating plate HPL. In an embodiment of the present inventive concept, as heat is applied to the first protective layer PF1 for about 1 minute to about 5 minutes at a temperature in a range of about 60° C. to about 100° C., the first protective layer PF1 and the first protective adhesive layer PF-PSA1 may be easily removed from the first display device assembly DAS1 without causing damage to a component disposed under the first protective layer PF1.

After heating the first display device assembly DAS1 as described above, the first protective layer PF may be detached from the first display device assembly DAS1. When the first protective layer PF1 is removed, the first protective adhesive layer PF-PSA1 may also be removed from the top of the first window GW1. For example, in an embodiment, the first protective adhesive layer PF-PSA1 and the first protective layer PF1 may be simultaneously removed. However, embodiments of the present inventive concept are not limited thereto.

After the first protective layer PF1 is removed, the first window GW1 may be removed by providing an acid solution EH on the first window GW1. Each of FIGS. 7A and 7B illustrates removing the first window in block S300 by providing an acid solution EH. FIG. 7A illustrates the first display device assembly DAS1 from which the first protective layer PF1 has been removed is immersed in the acid solution EH which is provided in a container (e.g., a bath). FIG. 7A illustrates that the first window GW1 is immersed in the acid solution EH. In contrast, in the embodiment of FIG. 7B, the acid solution EH is sprayed onto the first display device assembly DAS1 from which the first protective layer PF1 has been removed. FIG. 7B illustrates that the acid solution EH is sprayed through a first nozzle LT1 disposed above the first window GW1. In an embodiment, the first nozzle LT1 may include a plurality of nozzles arranged adjacent to the first window GW1 for spraying the acid solution EH. The acid solution EH may be provided on the upper surface of the first window GW1. The upper surface of the first window GW1 may be a surface adjacent to the first protective layer PF1 of the first display device assembly DAS1. For example, in an embodiment, the upper surface of the first window GW1 may be a surface in direct contact with the first protective adhesive layer PF-PSA1. In a method of manufacturing a display device according to an embodiment of the present inventive concept, the acid solution EH may be provided to directly contact the upper surface of the first window GW1. However, embodiments of the present inventive concept are not limited thereto and the method of providing the acid solution EH may vary. Further, while the acid solution EH is shown sprayed on one surface of the first window GW1, such as the upper surface of the first window GW1, embodiments of the present inventive concept are not limited thereto and the acid solution EH may be sprayed onto a plurality of surfaces of the first window GW1.

Referring to FIG. 7A, an auxiliary device AD may be used to immerse the first window GW1 in the acid solution EH. In an embodiment, the auxiliary device AD may include a fixed part FP and a moving part MP. For example, the moving part MP may be connected to a surface of the fixed part FP, such as a lower surface of the fixed part FP. By controlling the movement of the moving part MP, the first window GW1 and components under the first window GW1 may be immersed in the acid solution EH.

In an embodiment, a carrier film CM may be attached to the lower surface of the display module DM before providing the acid solution EH. For example, the carrier film CM may be attached to the lower surface of the support member SP (see FIG. 2). The carrier film CM may prevent damage to the display module DM by the acid solution EH. In addition, the carrier film CM may prevent the lower surface of the display module DM from being damaged by contact with a device or the like, such as the moving part MP of the auxiliary device AD, to be used during a manufacturing process of the display device. After the manufacturing process is finished, the carrier film CM may be removed.

The acid solution EH may decompose the first window GW1. For example, the acid solution EH may break a chemical bond in a material constituting the first window GW1. The first window GW1 may be broken down or decomposed by a chemical method in which the acid solution EH is provided. For example, in an embodiment in which the first window GW1 is formed of silicon dioxide, the acid solution EH may break the bond between an oxygen atom and a silicon atom. As the acid solution EH decomposes the first window GW1, the upper surface of the first window adhesive layer GW-PSA1 may be exposed. The upper surface of the first window adhesive layer GW-PSA1 may be in direct contact with the first window GW1. The upper surface of the first window adhesive layer GW-PSA1 and the lower surface of the first window adhesive layer GW-PSA1 may be opposite to each other in the third direction DR3.

According to an embodiment of the present inventive concept, the acid solution EH may contain at least one compound selected from hydrogen fluoride (HF), ammonium hydrogen fluoride ($NH_4HF_2$), and ammonium fluoride ($NH_4F$). In an embodiment in which the acid solution EH contains hydrogen fluoride, the hydrogen fluoride may be contained in an amount (e.g., a weight percent) in the range of about 0.1 wt % to about 30 wt % based on the total weight of the acid solution EH. In an embodiment in which the acid solution EH contains ammonium hydrogen fluoride, the ammonium hydrogen fluoride may be contained in an amount (e.g., a weight percent) in a range of about 0.5 wt % to about 50 wt % based on the total weight of the acid solution EH. In an embodiment in which the acid solution EH contains ammonium fluoride, the ammonium fluoride may be contained in an amount (e.g., a weight percent) in a range of about 0.5 wt % to about 50 wt % based on the total weight of the acid solution EH.

An acid solution containing less than about 0.1 wt % hydrogen fluoride, based on the total weight of the solution, may not be able to decompose the first window. An acid solution containing less than about 0.5 wt % ammonium hydrogen fluoride or less than about 0.5 wt % ammonium fluoride, based on the total weight of the solution, may not be able to decompose the first window. On the other hand, an acid solution containing more than 30 wt % hydrogen fluoride, based on the total weight of the solution, may damage components disposed under the first window. An acid solution containing more than 50 wt % ammonium hydrogen fluoride or more than 50 wt % ammonium fluoride, based on the total weight of the solution, may damage components disposed under the first window.

In addition, the acid solution EH may further contain at least one compound selected from sulfuric acid ($H_2SO_4$), hydrochloric acid (HCl), and nitroxyl (HNO). In an embodiment in which the acid solution EH further contains sulfuric acid, the sulfuric acid may be contained in an amount (e.g., a weight percent) in a range of about 0.1 wt % to about 20 wt % based on the total weight of the acid solution EH. In an embodiment in which the acid solution EH further contains hydrochloric acid, the hydrochloric acid may be contained in an amount (e.g., a weight percent) in a range of about 0.1 wt % to about 20 wt % based on the total weight of the acid solution EH. In an embodiment in which the acid solution EH further contains nitroxyl, the nitroxyl may be contained in an amount (e.g., a weight percent) in a range of about 0.1 wt % to about 20 wt % based on the total weight of the acid solution EH.

For example, the acid solution EH may contain hydrogen fluoride and further contain at least one compound selected from sulfuric acid, hydrochloric acid, and nitroxyl. The acid solution EH may contain hydrogen fluoride and ammonium hydrogen fluoride and further contain at least one compound selected from sulfuric acid, hydrochloric acid, and nitroxyl. The acid solution EH may contain hydrogen fluoride and ammonium fluoride, and further contain at least one compound selected from sulfuric acid, hydrochloric acid, and nitroxyl. The acid solution EH may contain hydrogen fluoride, ammonium hydrogen fluoride, and ammonium fluoride, and further contain at least one compound selected from sulfuric acid, hydrochloric acid, and nitroxyl. The acid solution EH may contain ammonium hydrogen fluoride, and further contain at least one compound selected from sulfuric acid, hydrochloric acid, and nitroxyl. The acid solution EH may contain ammonium hydrogen fluoride and ammonium fluoride, and further contain at least one compound selected from sulfuric acid, hydrochloric acid, and nitroxyl. The acid solution EH may contain ammonium fluoride, and further contain at least one compound selected from sulfuric acid, hydrochloric acid, and nitroxyl. However, embodiments of the present inventive concept are not limited thereto and other chemical solutions having a property which is capable of decomposing the first window GW1 may be used as the acid solution EH.

In an embodiment of the present inventive concept, the acid solution EH may be provided to the first window GW1 at a temperature in a range of about 10° C. to about 60° C. for about 5 minutes to about 30 minutes. In an embodiment in which the acid solution EH is provided at a temperature of less than about 10° C. or the acid solution EH is provided for less than about 5 minutes, the first window may not be decomposed. In addition, when the acid solution is provided at a temperature of more than about 60° C. or the acid solution is provided for more than about 30 minutes, components disposed under the first window may be damaged. In a method of manufacturing a display device according to an embodiment of the present inventive concept, the acid solution EH is provided at a temperature in a range of about 10° C. to about 60° C. for about 5 minutes to about 30 minutes so that the first window GW1 may be removed from the top of the first window adhesive layer GW-PSA1 without damaging a component such as the display module DM disposed under the first window GW1.

In an embodiment, after removing the first window in block S300, the first window adhesive layer GW-PSA1 may be cleaned. In an embodiment, when cleaning the first window adhesive layer GW-PSA1, a component such as the display module DM disposed under the first window adhesive layer GW-PSA1 may be cleaned together with the first window adhesive layer GW-PSA1. A solution, which is provided for cleaning the first window adhesive layer GW-PSA1 or the like, may remove the residue of the acid solution EH provided for removing the first window GW1. For example, in an embodiment, distilled water or the like, which is used in a semiconductor manufacturing process, may be used as the solution for cleaning the first window adhesive layer GW-PSA1 or the like. However, embodiments of the present inventive concept are not limited thereto, and the solution provided for cleaning the first window adhesive layer GW-PSA1 and other components, such as the display module DM, may vary.

Referring back to the fourth manufacturing step STEP 4 of FIG. 5, the second window GW2 may be provided above the display module DM from which the first protective layer PF1 and the first window GW1 are removed. For example, the second window GW2 may be disposed directly on the first window adhesive layer GW-PSA1. Subsequently, in the fifth manufacturing step STEP 5, the second protective adhesive layer PF-PSA2 and the second protective layer PF2 may be disposed above the second window GW2. A method of manufacturing a display device according to an embodiment of the present inventive concept may include providing a second window above the display module in block S400 and forming a second display device assembly in block S500 by providing a second protective layer PF2 above the second window.

In an embodiment of the present inventive concept, the second display device assembly DAS2 may include a display module DM, a second window GW2 disposed on the display module DM, and a second protective layer PF2 disposed on the second window GW2. A display device DD according to an embodiment of the present inventive concept may be formed from the second display device assembly DAS2. The second display device assembly DAS2 may be a display device DD according to an embodiment of the present inventive concept. The display device DD according to an embodiment of the present inventive concept may include the second window GW2 and the second protective layer PF2 disposed on the second window GW2. In the display device DD of FIG. 2, the window GW may be the second window GW2 of FIG. 5. In the display device DD of FIG. 2, the protective layer PF may be the second protective layer PF2 of FIG. 5. In addition, in the display device DD of FIG. 2, the protective adhesive layer PF-PSA may be the second protective adhesive layer PF-PSA2 of FIG. 5.

In an embodiment, the second display device assembly DAS2 may include a first optical adhesive layer NR-PSA1, a first optical film NR1, and a first window adhesive layer GW-PSA1 which are disposed between the display module DM and the second window GW2 (e.g., in the third direction DR3). The first optical adhesive layer NR-PSA1, the first optical film NR1, and the first window adhesive layer GW-PSA1 of the second display device assembly DAS2 may be the same as the first optical adhesive layer NR-PSA1, the first optical film NR1, and the first window adhesive layer GW-PSA1 of the first display device assembly DAS1. In a method of manufacturing a display device according to an embodiment of the present inventive concept, the first optical adhesive layer NR-PSA1, the first optical film NR1, and the first window adhesive layer GW-PSA1 among the components of the first display device assembly DAS1 may be reused by being included in both the first display device assembly DAS1 and the second display device assembly DAS2.

The reused first window adhesive layer GW-PSA1 may have a first adhesive strength to the first window GW1 and a second adhesive strength to the second window GW2. In an embodiment of the present inventive concept, a ratio of the first adhesive strength of the first window adhesive layer GW-PSA1 to the second adhesive strength of the first window adhesive layer GW-PSA1 may be in a range of about 1:1 to about 1:0.9. The first adhesive strength may be the adhesive strength of the first window adhesive layer GW-PSA1 before the acid solution EH is provided, and the second adhesive strength may be the adhesive strength of the first window adhesive layer GW-PSA1 after the acid solution EH is provided. In an embodiment, the second adhesive strength may be about 0.9 times to about 1.0 times the amount of the first adhesive strength. For example, in an embodiment, the second adhesive strength may be the same as the first adhesive strength. In an embodiment, the second adhesive strength may be less than the first adhesive strength and may be between about 0.9 times to less than about 1.0 times the first adhesive strength.

An adhesive layer having an adhesive strength which decreases by more than about 10% after providing the acid solution EH in comparison to prior to providing the acid solution EH may not be suitable for bonding the window and a component under the window. For example, in embodiments in which the second adhesive strength is less than about 0.9 times the amount of the first adhesive strength, the first window adhesive layer GW-PSA1 may be lifted or peeled off. In an embodiment of the present inventive concept, the first window adhesive layer GW-PSA1 having a ratio in a range of about 1:1 to about 1:0.9 between the first adhesive strength prior to providing the acid solution EH and the second adhesive strength after providing the acid solution may minimize the reduction in adhesive strength and the window adhesive layer GW-PSA1 may not be lifted or peeled off. The first window adhesive layer GW-PSA1 with a minimal amount of change in adhesive strength in the range of about 1:1 to about 1:0.9 between the first adhesive strength prior to providing the acid solution and the second adhesive strength after providing the acid solution may stably couple the second window GW2 and a component under the second window GW2.

In a method of manufacturing a display device according to an embodiment of the present inventive concept which includes replacing the window by providing an acid solution, components disposed under the window may not be damaged. The window may be replaced by removing a first window disposed above the display module by a chemical method and then providing a second window above the display module after the first window has been removed. Since components disposed under the window are not damaged when the acid solution is provided, in a method of manufacturing a display device according to an embodiment of the present inventive concept, the display device may be manufactured by reusing the components disposed under the window. Accordingly, the method of manufacturing the display device according to an embodiment of the present inventive concept may increase a manufacturing yield and reduce manufacturing costs of the display device.

Hereinafter, a method of manufacturing a display device according to an embodiment of the present inventive concept will be described with reference to FIGS. 8 to 11. In the description of the methods of FIGS. 8 to 11 hereinafter, the same reference numerals will be applied to the same contents as those described with reference to FIGS. 4 to 7B. In the description of the methods of FIGS. 8 to 11, similar or identical elements overlapping the elements described with respect to the methods of FIGS. 4 to 7B may not be described again, and mostly, differences will be described for convenience of explanation.

Figure 8:
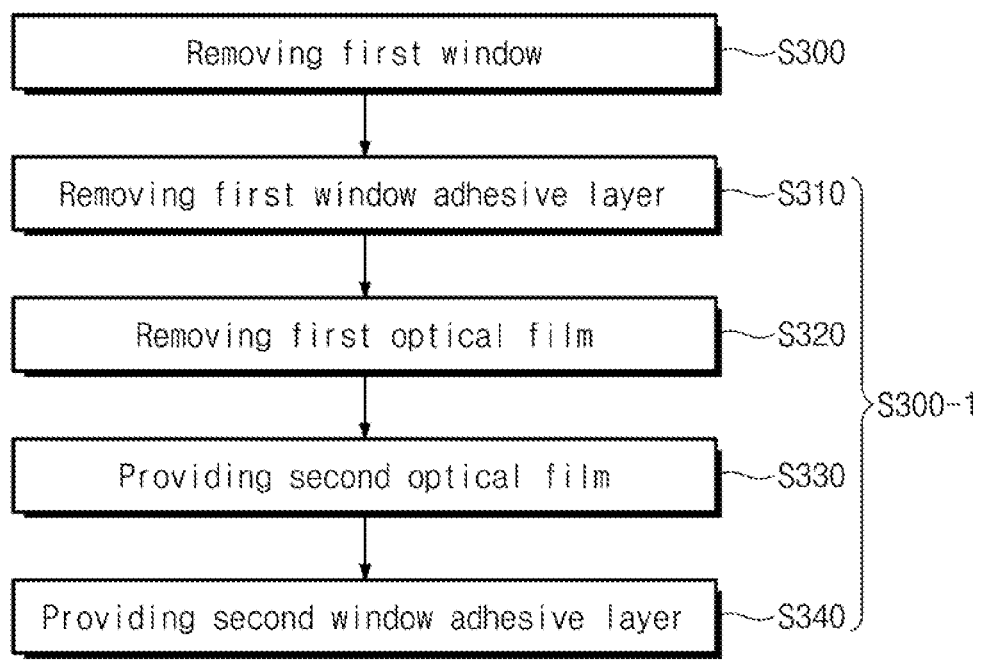
FIG. 8 is a flowchart illustrating a method of manufacturing a display device according to an embodiment of the present inventive concept.
Figure 9:
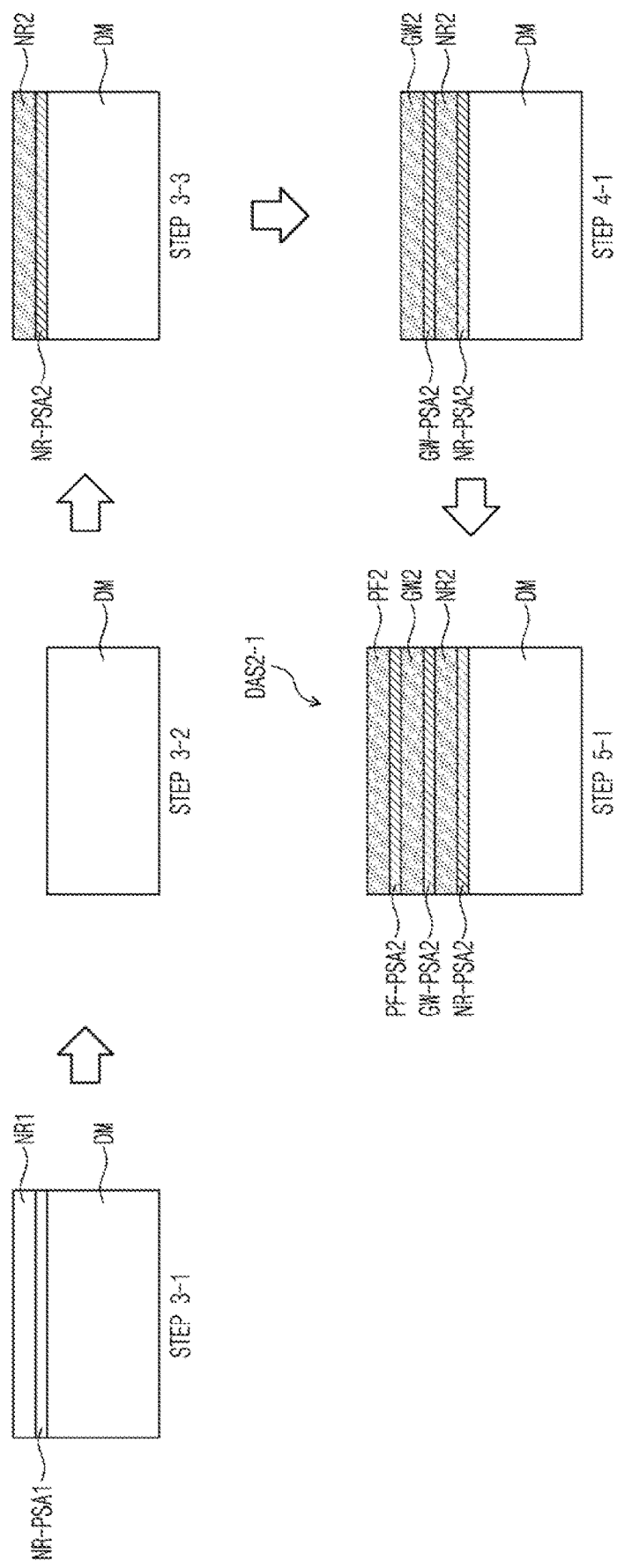
FIG. 9 is a diagram illustrating steps in the method of manufacturing the display device according to an embodiment of the present inventive concept.

FIG. 8 is a flowchart illustrating a method of manufacturing a display device according to an embodiment of the present inventive concept, and FIG. 9 is a diagram illustrating steps in the method of manufacturing the display device according to an embodiment of the present inventive concept.

FIG. 8 differs from the method described with reference to FIG. 4 in that the method of manufacturing the display device according to an embodiment of the present inventive concept further includes additional steps S300-1 after removing the first window in block S300.

Referring to FIG. 8, after removing the first window in block S300, the method of manufacturing the display device according to an embodiment of the present inventive concept may include removing the first window adhesive layer in block S310, removing the first optical film in block S320, providing a second optical film in block S330, and providing a second window adhesive layer in block S340. After providing the second window adhesive layer in block S340, as illustrated in FIG. 4, the providing of the second window in block S400 (see FIG. 4) and the providing of the second protective layer in block S500 (see FIG. 4) may be performed.

FIG. 9 sequentially illustrates a manufacturing step 3-1 STEP 3-1, a manufacturing step 3-2 STEP 3-2, a manufacturing step 3-3 STEP 3-3, a manufacturing step 4-1 STEP 4-1, and a manufacturing step 5-1 STEP 5-1, which are performed after the third manufacturing step STEP 3 in which the first window GW1 is removed. The manufacturing step 3-1 STEP 3-1 and the manufacturing step 3-2 STEP 3-2 illustrate states in which components disposed above the display module DM are removed, and the manufacturing step 3-3 STEP 3-3, the manufacturing step 4-1 STEP 4-1, and the manufacturing step 5-1 STEP 5-1 illustrate states in which new components are provided above the display module DM.

The manufacturing step 3-1 STEP 3-1 illustrates a state in which the first window adhesive layer GW-PSA1 is removed. The manufacturing step 3-1 STEP 3-1 illustrates a state in which the first optical adhesive layer NR-PSA1 and the first optical film NR1 are stacked above the display module DM (e.g., in the third direction DR3). The manufacturing step 3-2 STEP 3-2 illustrates a state in which the first optical adhesive layer NR-PSA1 and the first optical film NR1 are removed from the top of the display module DM and only the display module DM remains.

The manufacturing step 3-3 STEP 3-3 illustrates a state in which a second optical adhesive layer NR-PSA2 and a second optical film NR2 are provided above the display module DM. For example, a lower surface of the second optical adhesive layer NR-PSA2 may be disposed on an upper surface of the display module DM (e.g., in the third direction DR3). A lower surface of the second optical film NR2 may be disposed on an upper surface of the second optical adhesive layer NR-PSA2 (e.g., in the third direction DR3). The manufacturing step 4-1 STEP 4-1 illustrates a state in which a second window adhesive layer GW-PSA2 and the second window GW2 are provided above the second optical film NR2. For example, a lower surface of the second window adhesive layer GW-PSA2 may be disposed on an upper surface of the second optical film NR2 (e.g., in the third direction DR3). A lower surface of the second window GW2 may be disposed on an upper surface of the second window adhesive layer GW-PSA2 (e.g., in the third direction DR3). The manufacturing step 4-1 STEP 4-1 illustrates a state in which the second optical adhesive layer NR-PSA2, the second optical film NR2, the second window adhesive layer GW-PSA2, and the second window GW2 are consecutively stacked (e.g., in the third direction DR3).

The manufacturing step 5-1 STEP 5-1 illustrates a state in which the second protective adhesive layer PF-PSA2 and the second protective layer PF2 are provided above the second window GW2. For example, a lower surface of the second protective adhesive layer PF-PSA2 may be disposed on an upper surface of the second window GW2 (e.g., in the third direction DR3). A lower surface of the second protective layer PF2 may be disposed on an upper surface of the second protective adhesive layer PF-PSA2 (e.g., in the third direction DR3). The manufacturing step 5-1 STEP 5-1 illustrates a second display device assembly DAS2-1, and unlike the second display device assembly DAS2 in FIG. 5, the second display device assembly DAS2-1 includes the second optical adhesive layer NR-PSA2, the second optical film NR2, and the second window adhesive layer GW-PSA2 and does not include the first optical adhesive layer NR-PSA1, the first optical film NR1 and the first window adhesive layer GW-PSA1. The second optical adhesive layer NR-PSA2, the second optical film NR2, and the second window adhesive layer GW-PSA2 may be disposed between the display module DM and the second window GW2 (e.g., in the third direction DR3).

In the display device DD of FIG. 2, the optical film NR and the optical adhesive layer NR-PSA may be the second optical film NR2 and the second optical adhesive layer NR-PSA2 of FIG. 9, respectively. The display module DM included in the second display device assemblies DAS2 and DAS2-1 may be the same as the display module DM of the first display device assembly DAS1. At least one of the components included in the first display device assembly DAS1 may be reused. For example, the display module DM of the first display device assembly DAS1 may be reused. In addition, when the first display device assembly DAS1 further includes a polarizing layer POL (see FIG. 2) and a polarizing adhesive layer POL-PSA (see FIG. 2) disposed between the display module DM and the first optical film NR1, the polarizing layer POL (see FIG. 2) and the polarizing adhesive layer POL-PSA (see FIG. 2) may be reused.

In an embodiment, prior to attaching a carrier film CM to the lower surface of the display module DM, the flexible circuit board FB (see FIG. 2) of the display module DM may be separated from the display panel DP. The separated flexible circuit board FB (see FIG. 2) may be used again after providing the second protective layer PF2. In a method of manufacturing a display device according to an embodiment of the present inventive concept, the flexible circuit board FB (see FIG. 2) may be reused. As described above, the display module DM of the first display device assembly DAS1 may be the same as the display module DM of the second display device assemblies DAS2 and DAS2-1 of FIGS. 5 and 9. The flexible circuit board FB (see FIG. 2) included in the display module DM of the first display device assembly DAS1 may be the same as the flexible circuit board FB (see FIG. 2) included in the display module DM of the second display device assemblies DAS2 and DAS2-1 of FIGS. 5 and 9.

Figure 10:
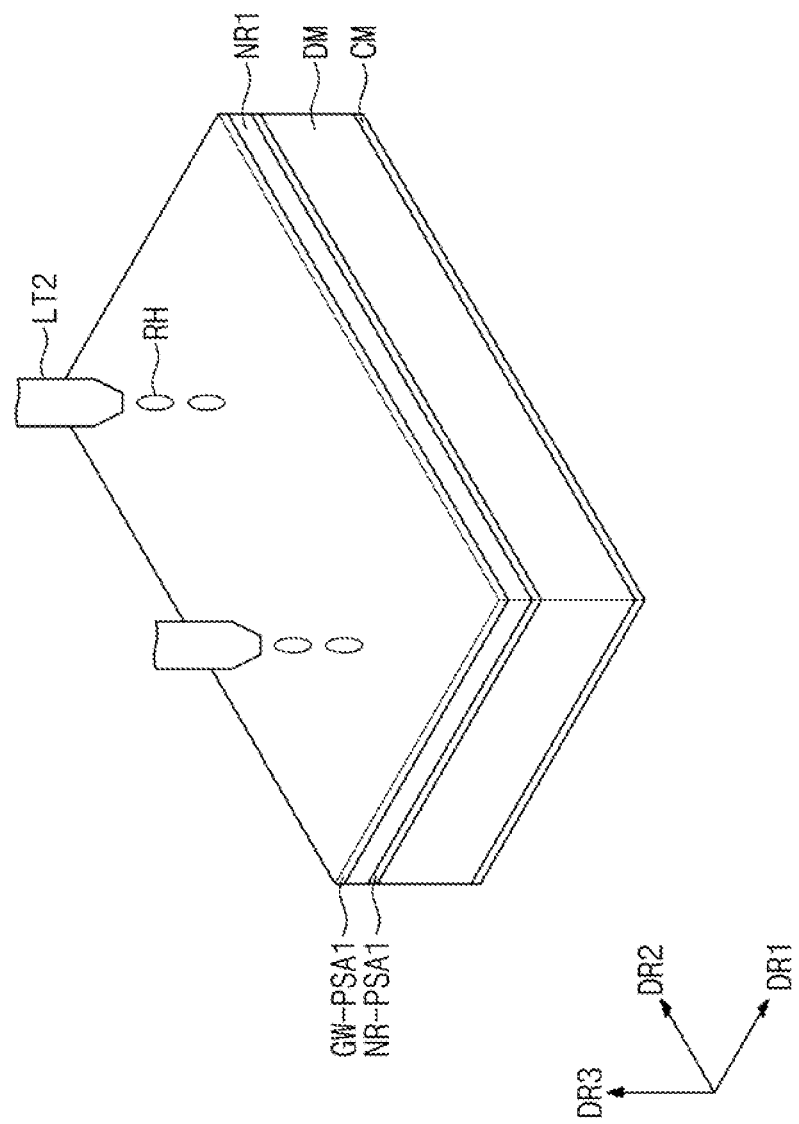
FIG. 10 is a perspective view schematically illustrating steps in the method of manufacturing the display device according to an embodiment of the present inventive concept.

Referring to FIG. 10, after the first window GW1 is removed, the first window adhesive layer GW-PSA1 may be removed. In an embodiment, a removal solution RH may be provided to remove the first window adhesive layer GW-PSA1. The removal solution RH may be provided through a second nozzle LT2 disposed above the first window adhesive layer GW-PSA1. The removal solution RH may be provided so that the removal solution RH directly contacts the upper surface of the first window adhesive layer GW-PSA1. However, embodiments of the present inventive concept are not limited thereto, and the method of providing the removal solution RH may vary. For example, the first window adhesive layer GW-PSA1 may be immersed in the removal solution RH in some embodiments. In an embodiment, the second nozzle LT2 may include a plurality of nozzles and the removal solution RH may be sprayed on at least one surface of the first window adhesive layer GW-PSA1.

The removal solution RH may separate the bonds of a material included in the first window adhesive layer GW-PSA1. For example, in an embodiment, the removal solution RH may include a hydrocarbon including a ketone group or an alcohol group as a functional group. In an embodiment, the removal solution RH may include at least one compound selected from acetone ($CH_3COCH_3$), methanol ($CH_3OH$), ethanol ($C_2H_5OH$), and isopropyl alcohol ($C_3H_8O$). However, embodiments of the present inventive concept are not limited thereto and the removal solution RH may be various different compounds capable of separating the bonds of the material included in the first window adhesive layer GW-PSA1.

After providing the removal solution RH, the cleaning of components such as the first optical film NR1 and the display module DM may be performed. In the step of cleaning the first optical film NR1 and the display module DM, the removal solution RH and the like remaining on the first optical film NR1 may be wiped off.

Figure 11:
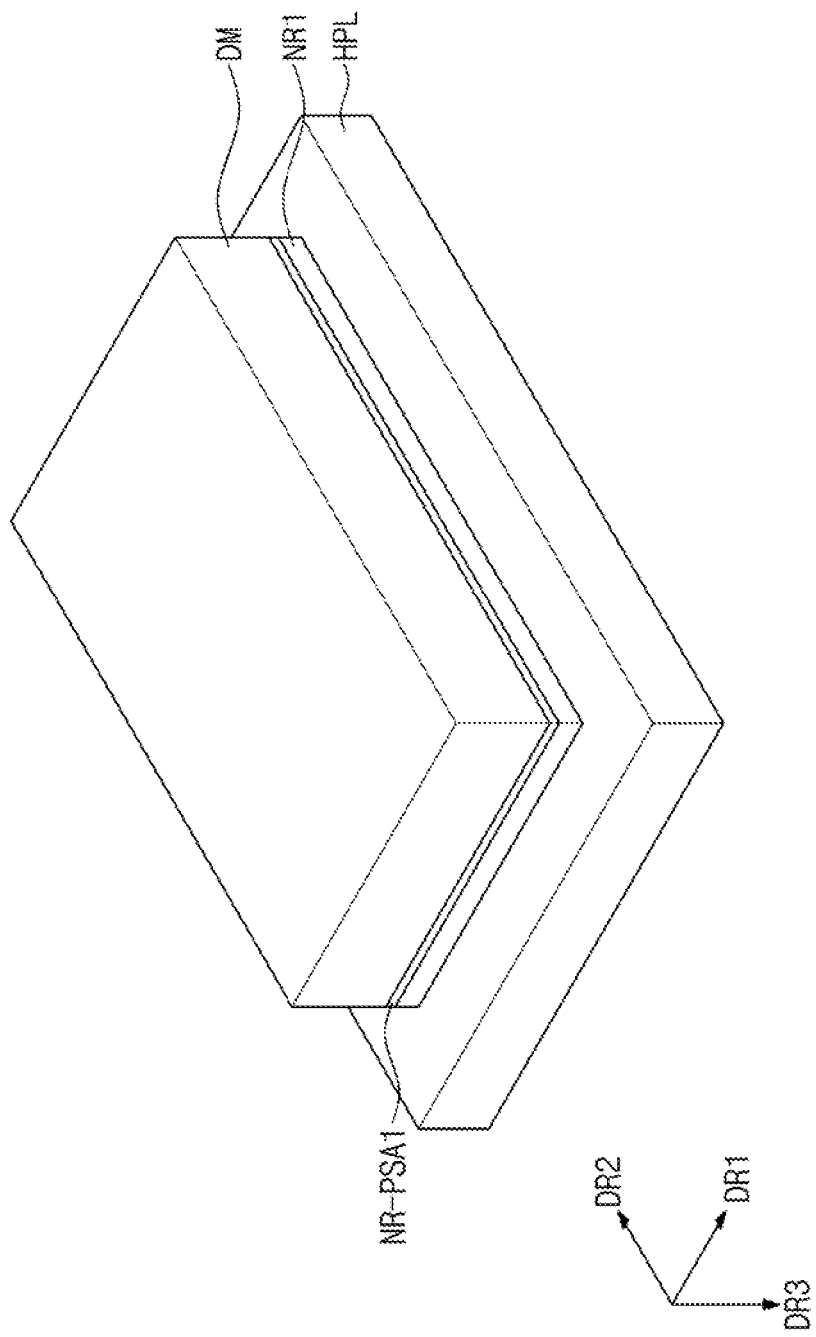
FIG. 11 is a perspective view schematically illustrating steps in the method of manufacturing the display device according to an embodiment of the present inventive concept.

After the first window adhesive layer GW-PSA1 is removed, the first optical film NR1 may be removed. FIG. 11 illustrates that heat is applied to remove the first optical film NR1. For example, in an embodiment, the first optical film NR1 may be mounted on (e.g., disposed on) a heating plate HPL. Components such as the first optical film NR1 and the display module DM may be mounted above (e.g., disposed above) the heating plate HPL so that the upper surface of the first optical film NR1 directly contacts the heating plate HPL. In an embodiment, the top surface of the first optical film NR1 may be adjacent to the first window adhesive layer GW-PSA1 (e.g., in the third direction DR3). For example, the upper surface of the first optical film NR1 and the lower surface of the first optical film NR1 may face each other in the third direction DR3.

In an embodiment, applying heat to the first optical film NR1 may be performed at a temperature in a range of about 60° C. to about 100° C. for about 1 minute to about 5 minutes. In embodiments in which heat is applied at a temperature of less than about 60° C., or heat is applied for less than about 1 minute, the first optical film may not be removed. In addition, in embodiments in which heat is applied at a temperature of greater than about 100° C., or heat is applied for more than about 5 minutes, a component such as a display module or the like disposed under the first optical film may be damaged. In a method of manufacturing a display device according to an embodiment of the present inventive concept, as heat is applied to the first optical film NR1 at a temperature in a range of about 60° C. to about 100° C., or for about 1 minute to about 5 minutes, the first optical film NR1 may be easily removed. When heat is applied, the first optical adhesive layer NR-PSA1 is softened so that the first optical film NR1 and the first optical adhesive layer NR-PSA1 may be removed from the top of the display module DM. In an embodiment, the first optical adhesive layer NR-PSA1 may be removed together with (e.g., simultaneously with) the optical film NR1. However, embodiments of the present inventive concept are not limited thereto, and the first optical adhesive layer NR-PSA1 may be removed by a process that is separate from the process of removing the first optical film NR1.

After the first optical film NR1 is removed, the second optical film NR2 may be provided above the display module DM. The second optical film NR2 may be provided together with the second optical adhesive layer NR-PSA2. The second optical adhesive layer NR-PSA2 and the second optical film NR2 may be provided above the display module DM in a coupled state. After the second optical film NR2 is provided, the second window GW2 may be provided, and the second window GW2 may be provided together with the second window adhesive layer GW-PSA2. The second window GW2 may be provided on the second window adhesive layer GW-PSA2 in a coupled state. The second protective layer PF2 may be provided above the second window GW2, and the second protective layer PF2 may be provided together with the second protective adhesive layer PF-PSA2. The second protective layer PF2 may be provided on the second protective adhesive layer PF-PSA2 in a coupled state. As the second protective layer PF2 is provided, the second display device assembly DAS2-1 may be manufactured. However, embodiments of the present inventive concept are not limited thereto, and the method of providing the second optical film NR2, the second window GW2, and the second protective layer PF2 may vary. For example, the second optical film NR2 and the second optical adhesive layer NR-PSA2 may be separately provided. The second window GW2 and the second window adhesive layer GW-PSA2 may be separately provided. In addition, the second protective layer PF2 and the second protective adhesive layer PF-PSA2 may be separately provided.

During the manufacture of a display device, defects may occur in members, such as a protective layer, a window, and an optical film, constituting the display device. A method of manufacturing a display device according to an embodiment of the present inventive concept may include a method of replacing a defective window, and components disposed under the window may be reused. A method of manufacturing a display device may include a window replacement method in which components disposed under the first window GW1 may be reused. A method of manufacturing a display device according to an embodiment of the present inventive concept may include a method of replacing the first window GW1 with the second window GW2.

A method of manufacturing a display device according to an embodiment of the inventive concept may include removing the first window by providing an acid solution in block S300 and providing the second window above the display module after the first window has been removed in block S400, and components such as the display module DM disposed under the window GW1 may be reused. The acid solution EH may remove only the first window GW1 and may not damage components disposed under the first window GW1 so that the components disposed under the first window GW1 may be reused. Accordingly, the method of manufacturing the display device according to an embodiment of the present inventive concept may increase manufacturing yield and reduce manufacturing costs for manufacturing a display device.

Table 1 below shows the measurements of the adhesive strength of the window adhesive layer to the window before and after providing an acid solution. In Table 1, the adhesive strength A is the adhesive strength of the first window adhesive layer measured prior to providing the acid solution for removing the first window, and the adhesive strength B is the adhesive strength of the first window adhesive layer measured after providing the acid solution. The adhesive strength A represents a first adhesive strength of the first window adhesive layer, and the adhesive strength B represents a second adhesive strength of the first window adhesive layer. In an embodiment, a solution containing 5 wt % hydrogen fluoride based on the total weight of the solution was used as the acid solution for removing the window.

The adhesive strength in Table 1 was measured by a 180-degree peel test method. When measuring the adhesive strength, a TA.XTplus-EXT from Stable Micro Systems was used, and an adhesive layer having a width of about 25 mm was used as a sample. At room temperature, after 30 minutes have passed since the adhesive layer was attached to a glass substrate, the adhesive strength of the adhesive layer was measured. The measuring of each of the adhesive strength A and the adhesive strength B was performed eight times, and the average value of eight measurements is shown.

TABLE 1

| Division | Adhesive strength (kgf/25 mm) |
| --- | --- |
| Adhesive strength A | 1473.7 |
| Adhesive strength B | 1426.3 |

Referring to Table 1, it can be seen that the adhesive strength B is in a range of about 0.9 times to about 1.0 times the adhesive strength A. For example, the adhesive strength B is about 3 to 4 percent decrease (e.g., 3.2%) in adhesive strength compared to the adhesive strength A. The amount of change in adhesive strength between before and after providing the acid solution is within about 10%.

A method of manufacturing a display device according to an embodiment of the present inventive concept may include removing the first window by providing an acid solution, and a ratio of the first adhesive strength before providing the acid solution to the second adhesive strength after providing the acid solution may be in a range of about 1:1 to about 1:0.9. Accordingly, the method of manufacturing the display device according to an embodiment of the present inventive concept, which includes removing the first window by providing the acid solution, may maintain reliability of the window adhesive layer.

According to an embodiment of the present inventive concept, a method of manufacturing a display device may include providing a first display device assembly, removing a first protective layer, removing a first window, providing a second window, and providing a second protective layer. The first display device assembly may include a display module, a first window disposed on the display module, and a first protective layer disposed on the first window. An acid solution may be provided to chemically decompose the first window for removal of the first window. When the acid solution is provided, only the first window may be removed without damaging components such as the display module disposed under the first window. Only the first window in which the defect occurs may be removed, and the components such as the display module, which are not damaged, may be reused to manufacture the display device. A display device manufactured according to a method of manufacturing a display device in an embodiment of the present inventive concept may be manufactured by reusing a display module or the like. Accordingly, the method of manufacturing the display device according to an embodiment of the present inventive concept may increase the manufacturing yield and reduce manufacturing costs.

In addition, the first display device assembly may include a first window adhesive layer disposed under the first window, and the first window adhesive layer may have a first adhesive strength and a second adhesive strength. The first adhesive strength may be an adhesive strength prior to providing an acid solution. The second adhesive strength may be an adhesive strength after providing the acid solution. A ratio of the first adhesive strength to the second adhesive strength may be in a range of about 1:1 to about 1:0.9. Accordingly, the method of manufacturing the display device according to an embodiment of the present inventive concept may maintain the reliability of the window adhesive layer.

A method of manufacturing a display device according to an embodiment of the present inventive concept may include removing a window by providing an acid solution so that components such as a display module disposed under the window may be reused.

In addition, since the components such as the display module disposed under the window may be reused, the method of manufacturing the display device according to an embodiment of the present inventive concept may increase a manufacturing yield and reduce manufacturing costs of a method of manufacturing a display device.

Although the above has been described with reference to embodiments of the present inventive concept, those skilled in the art or those of ordinary skill in the art will understand that the present inventive concept may be variously modified and changed without departing from the scope of the present inventive concept and should not be limited the above-described embodiments.

What is claimed is:

1. A method for manufacturing a display device, the method comprising:
providing a first display device assembly comprising a display module, a first window disposed on the display module, a first window adhesive layer disposed between the display module and the first window, and a first protective layer disposed on the first window;
removing the first protective layer;
removing the first window by providing an acid solution on the first display device assembly;
providing a second window that is disposed on the display module after the first window is removed; and
providing a second protective layer that is disposed on the second window after the first protective layer is removed.

2. The method of claim 1, wherein the providing of the acid solution on the first display device assembly comprises immersing the first display device assembly in the acid solution.

3. The method of claim 1, wherein the removing of the first window comprises spraying the acid solution onto a surface of the first window.

4. The method of claim 1, wherein the removing of the first window is performed by providing the acid solution at a temperature in a range of about 10° C. to about 60'C for about 5 minutes to about 30 minutes.

5. The method of claim 1, wherein the acid solution comprises at least one compound selected from hydrogen fluoride (HF), ammonium hydrogen fluoride ($NH_4HF_2$), and ammonium fluoride ($NH_4F$).

6. The method of claim 5, wherein:
a weight percent of hydrogen fluoride is in a range of about 0.1 wt % to about 30 wt % based on a total weight of the acid solution; and
a weight percent of each of the ammonium hydrogen fluoride and the ammonium fluoride is in a range of about 0.5 wt % to about 50 wt % based on the total weight of the acid solution.

7. The method of claim 5, wherein the acid solution further comprises at least one compound selected from sulfuric acid ($H_2SO_4$), hydrochloric acid (HCl), and nitroxyl (HNO).

8. The method of claim 7, wherein a weight percent of each of the sulfuric acid, the hydrochloric acid, and the nitroxyl is in a range of about 0.1 wt % to about 20 wt % based on a total weight of the acid solution.

9. The method of claim 1, wherein the first protective layer is removed by applying heat to the first display device assembly, the applying of the heat to the first display device assembly comprises:
disposing the first display device assembly on a heating plate so that an upper surface of the first protective layer is adjacent to the heating plate;
heating the first display device assembly at a temperature in a range of about 60° C. to about 100° C. for about 1 minute to about 5 minutes; and
detaching the first protective layer from the first display device assembly.

10. The method of claim 1, further comprising:
after the removing of the first window:
removing the first window adhesive layer by providing a removal solution on the first window adhesive layer; and
providing a second window adhesive layer on the display module after the first window adhesive layer is removed,
wherein the removal solution comprises at least one compound selected from acetone ($CH_3COCH_3$), methanol ($CH_3OH$), ethanol ($C_2H_5OH$), and isopropyl alcohol ($C_3H_8O$).

11. The method of claim 1, wherein:
the first display device assembly further comprises an optical film disposed between the display module and the first window; and
after the removing of the first window, the method further comprises removing the optical film by applying heat to the optical film.

12. The method of claim 1, further comprising cleaning the first window adhesive layer and the display module after the removing of the first window.

13. The method of claim 1, further comprising attaching a carrier film to a lower surface of the display module before the providing of the acid solution.

14. The method of claim 1, wherein:
the display module comprises a display panel and a flexible circuit board disposed on a first side of the display panel; and
the method further comprises separating the flexible circuit board from the first side of the display panel before the removing of the first window.

15. The method of claim 14, further comprising providing the separated flexible circuit board to the first side of the display panel after the providing of the second protective layer.

16. The method of claim 1, wherein a thickness of the first window is in a range of about 20 μm to about 100 m.

17. The method of claim 1, wherein a thickness of the first window adhesive layer is in a range of about 5 μm to about 30 μm.

18. A method for manufacturing a display device, the method comprising:
providing a first display device assembly including a display module, a first window adhesive layer disposed on the display module, a first window disposed on the first window adhesive layer, and a first protective layer disposed on the first window;
removing the first protective layer;
removing the first window by providing an acid solution on the first display device assembly;
providing a second window that is disposed on the display module after the first window has been removed; and
forming a second display device assembly by providing a second protective layer on the second window,
wherein a ratio of a first adhesive strength of the first window adhesive layer to the first window to a second adhesive strength of the first window adhesive layer to the second window is in a range of about 1:1 to about 1:0.9.

19. The method of claim 18, wherein:
the acid solution comprises at least one compound selected from hydrogen fluoride (HF) having a weight percent in a range of about 0.1 wt % to about 30 wt % based on a total weight of the acid solution, ammonium hydrogen fluoride ($NH_4HF_2$) having a weight percent in a range of about 0.5 wt % to about 50 wt % based on the total weight of the acid solution, and ammonium fluoride ($NH_4F$) having a weight percent in a range of about 0.5 wt % to about 50 wt % based on the total weight of the acid solution.

20. The method of claim 18, wherein:
the acid solution further comprises at least one compound selected from sulfuric acid ($H_2SO_4$), hydrochloric acid (HCl), and nitroxyl (HNO),
wherein a weight percent of each of the sulfuric acid, the hydrochloric acid, and the nitroxyl is in a range of about 0.1 wt % to about 20 wt % based on a total weight of the acid solution.

21. A method for manufacturing a display device, the method comprising:
providing a first display device assembly comprising a display module, a first window disposed on the display module, and a plurality of first layers disposed between the first window and the display module, the plurality of first layers including at least one of a first optical adhesive layer, a first optical layer, and a first window adhesive layer;
removing the first window by providing an acid solution on the first display device assembly;
providing a second window that is disposed on the display module after the first window is removed to provide a second display device assembly,
wherein the second display device assembly includes at least one of the plurality of first layers included in the first display device assembly.

22. The method of claim 21, further including removing at least one of the plurality of first layers and replacing each of the at least one of the plurality of first layers that was removed with a second layer to form the second display device assembly.

\* \* \* \* \*